US008861273B2

(12) United States Patent
Lue

(10) Patent No.: US 8,861,273 B2
(45) Date of Patent: Oct. 14, 2014

(54) BANDGAP ENGINEERED CHARGE TRAPPING MEMORY IN TWO-TRANSISTOR NOR ARCHITECTURE

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 791 days.

(21) Appl. No.: 12/427,587

(22) Filed: Apr. 21, 2009

(65) Prior Publication Data
US 2010/0265766 A1 Oct. 21, 2010

(51) Int. Cl.
G11C 16/04 (2006.01)
H01L 21/28 (2006.01)
H01L 29/423 (2006.01)
H01L 27/115 (2006.01)
H01L 29/51 (2006.01)

(52) U.S. Cl.
CPC ...... H01L 21/28282 (2013.01); H01L 29/4234 (2013.01); H01L 27/11565 (2013.01); G11C 16/0433 (2013.01); H01L 27/11568 (2013.01); H01L 29/513 (2013.01)
USPC ............. 365/185.17; 365/185.27; 365/185.28

(58) Field of Classification Search
USPC ............................ 365/185.17, 185.27, 185.28
See application file for complete search history.

(56) References Cited

U.S. PATENT DOCUMENTS

| RE31,083 E | 11/1982 | DeKeersmaecker et al. |
| 4,630,086 A | 12/1986 | Sato et al. |
| 5,286,994 A | 2/1994 | Ozawa et al. |
| 5,319,229 A | 6/1994 | Shimoji et al. |
| 5,952,692 A | 9/1999 | Nakazato et al. |
| 6,011,725 A | 1/2000 | Eitan et al. |
| 6,026,026 A | 2/2000 | Chan et al. |
| 6,074,917 A | 6/2000 | Chang et al. |
| 6,169,693 B1 | 1/2001 | Chan et al. |

(Continued)

FOREIGN PATENT DOCUMENTS

| CN | 101207135 A | 6/2008 |
| EP | 0016246 | 10/1980 |

(Continued)

OTHER PUBLICATIONS

Shin, Yoocheol, et al., "High Reliable SONOS-type NAND Flash Memory Cell with Al$_2$O$_3$ for Top Oxide," NVSMW Monterey, CA Feb. 16-20, 2003, 2 pages.

(Continued)

*Primary Examiner* — Harry W Byrne
*Assistant Examiner* — Lance Reidlinger
(74) *Attorney, Agent, or Firm* — Kenta Suzue; Haynes Beffel & Wolfeld LLP

(57) ABSTRACT

A 2T cell NOR architecture based on the use of BE-SONOS for embedded memory includes memory cells having respective access transistors having access gates and memory transistors having memory gates arranged in series between the corresponding bit lines and one of the plural reference lines. A memory transistor in a memory cell comprises a semiconductor body including a channel having a channel surface and a charge storing dielectric stack between the memory gate and the channel surface. The dielectric stack comprises a bandgap engineered, tunneling dielectric layer contacting one of the gate (for gate injection tunneling) and the channel surface (for channel injection tunneling). The dielectric stack of the memory cell also includes a charge trapping dielectric layer on the tunneling dielectric layer and a blocking dielectric layer.

35 Claims, 19 Drawing Sheets

(56) References Cited

U.S. PATENT DOCUMENTS

| | | | |
|---|---|---|---|
| 6,218,700 | B1 | 4/2001 | Papadas et al. |
| 6,469,343 | B1 | 10/2002 | Miura et al. |
| 6,512,696 | B1 | 1/2003 | Fan et al. |
| 6,605,840 | B1 | 8/2003 | Wu et al. |
| 6,628,544 | B2 | 9/2003 | Shum et al. |
| 6,709,928 | B1 | 3/2004 | Jenne et al. |
| 6,720,630 | B2 | 4/2004 | Mandelman et al. |
| 6,740,928 | B2 | 5/2004 | Yoshii et al. |
| 6,784,480 | B2 | 8/2004 | Bhattacharyya |
| 6,815,764 | B2 | 11/2004 | Bae et al. |
| 6,818,558 | B1 | 11/2004 | Rathor et al. |
| 6,858,906 | B2 | 2/2005 | Lee et al. |
| 6,897,533 | B1 | 5/2005 | Yang et al. |
| 6,912,163 | B2 | 6/2005 | Zheng et al. |
| 6,977,201 | B2 | 12/2005 | Jung et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,158,411 | B2 | 1/2007 | Yeh et al. |
| 7,187,590 | B2 | 3/2007 | Zous et al. |
| 7,206,227 | B1 | 4/2007 | Wu et al. |
| 7,233,526 | B2 * | 6/2007 | Umezawa ............... 365/185.27 |
| 7,315,474 | B2 * | 1/2008 | Lue ........................ 365/185.18 |
| 7,426,140 | B2 | 9/2008 | Lue |
| 7,442,988 | B2 | 10/2008 | Oh et al. |
| 7,473,589 | B2 | 1/2009 | Lai et al. |
| 7,592,666 | B2 * | 9/2009 | Noguchi et al. ............... 257/324 |
| 7,646,056 | B2 | 1/2010 | Choi et al. |
| 7,687,845 | B2 | 3/2010 | Arigane et al. |
| 7,816,727 | B2 * | 10/2010 | Lai et al. ..................... 257/324 |
| 7,973,366 | B2 * | 7/2011 | Ho et al. ..................... 257/365 |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0224564 | A1 | 12/2003 | Kang et al. |
| 2004/0079983 | A1 | 4/2004 | Chae et al. |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0062098 | A1 | 3/2005 | Mahajani et al. |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0114722 | A1 * | 6/2006 | Yokoi et al. ............... 365/185.18 |
| 2006/0118858 | A1 | 6/2006 | Jeon et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2007/0138539 | A1 | 6/2007 | Wu et al. |
| 2007/0201276 | A1 * | 8/2007 | Ho et al. ................. 365/185.18 |
| 2008/0099830 | A1 | 5/2008 | Lue et al. |
| 2008/0116506 | A1 | 5/2008 | Lue |
| 2008/0268596 | A1 | 10/2008 | Pham et al. |
| 2009/0039417 | A1 | 2/2009 | Chen et al. |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 11040682 | 2/1999 |
| JP | 2004363329 | 12/2004 |

OTHER PUBLICATIONS

Shin, Yoocheol, et al., "A Novel NAND-type MONOS Memory using 63 nm Process Technology for a Multi-Gigabit Flash EEPROMs", IEEE 2005, 4 pages.

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

(56) References Cited

OTHER PUBLICATIONS

Lee, Chang, et al., "A Novel SONOS Structure of SiO2/Si28Z7I2O3 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Likharev, "Layered Tunnel Barriers for Nonvolatile Memory Devices," Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38(11) Nov 1991 2519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 (Pub. No. EP-01677312) filed on Jan. 3, 2006, 4 pages.

Search Report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tao, Guoqiao, et al., "A Quantitative Study of Endurance Characteristics and Its Temperature Dependance of Embedded Flash Memories With 2T-FNFN NOR Device Architecture," IEEE Transactions on Device and Materials Reliability vol. 7 No. 2 Jun. 2007, 6 pages.

Tsai et al., "Novel SONOS-Type Nonvolatile Memory Device with Suitable Band Offset in HfAlO Charge-Trapping Layer," Int'l Symp. on VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch 2-Bit per Cell Flash Memory," IEDM Tech. Dig. 2002, 931-934.

Office action mailed Jul. 24, 2012 in related application CN 201010167275.6, 16pp.

\* cited by examiner

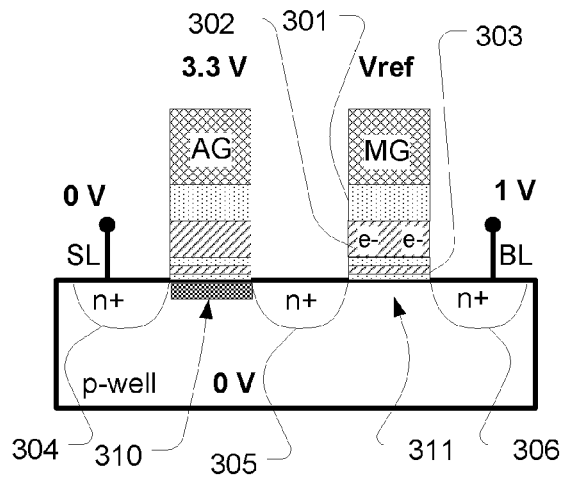
Fig. 14 – Read High Vt
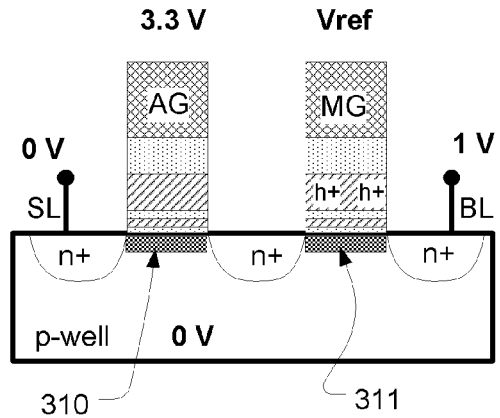
Fig. 15 – Read Low Vt
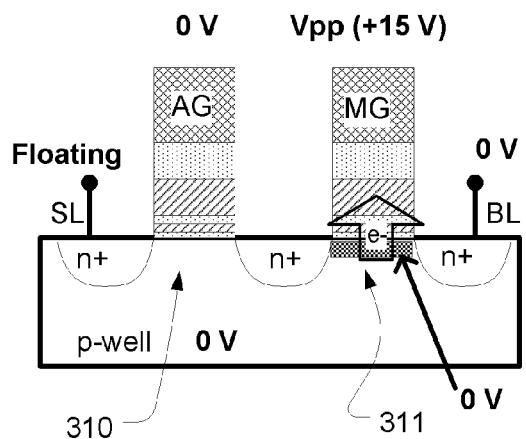
Fig. 16 – +FN Program
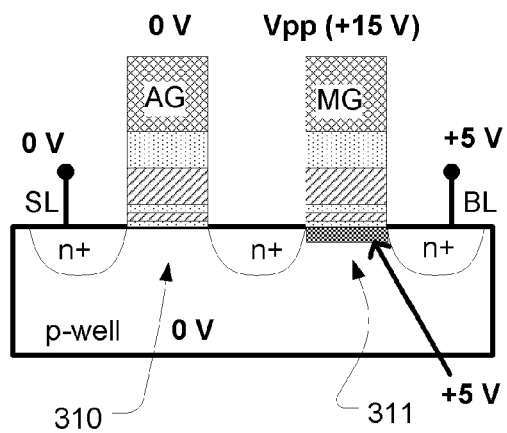
Fig. 17 – +FN Unselected Cell
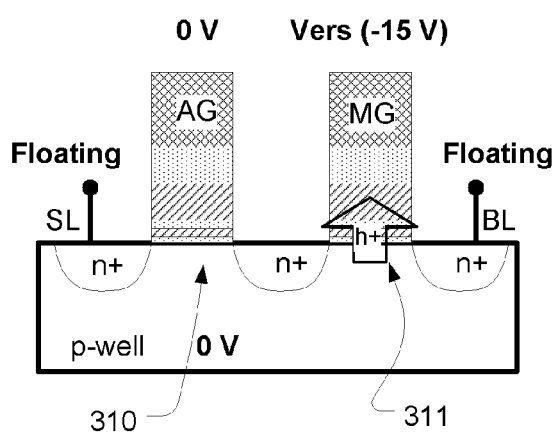
Fig. 18 – -FN Sector Erase

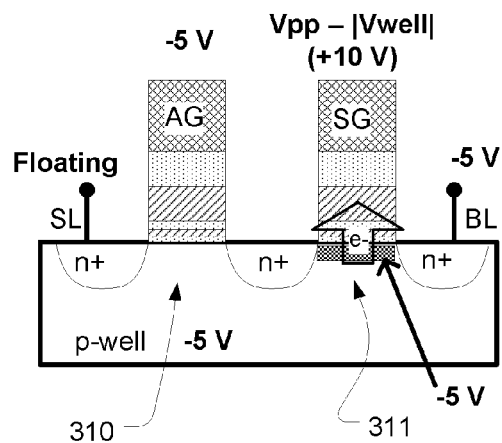
Fig. 19 – +FN Program
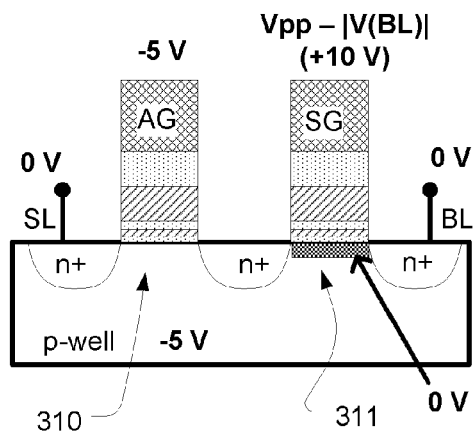
Fig. 20 – +FN Unselected Cell
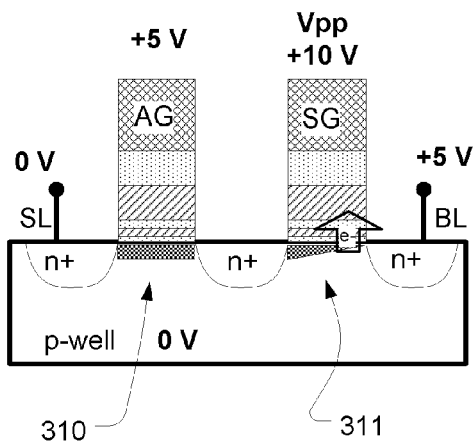
Fig. 21 – CHE Program
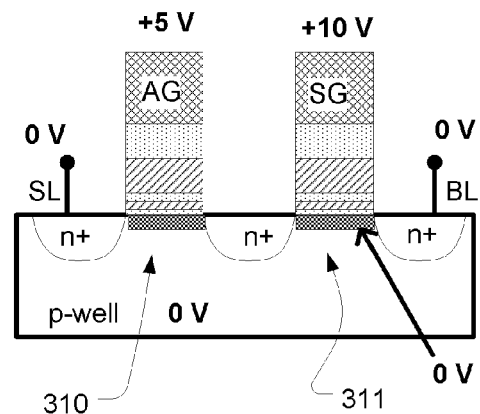
Fig. 22 – CHE Unselected Cell

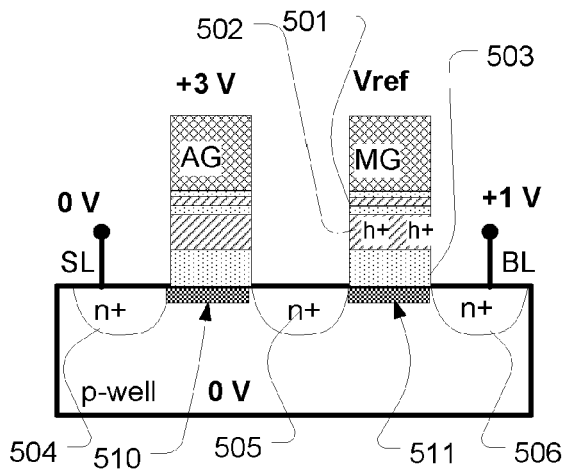
Fig. 27 – Read Low Vt
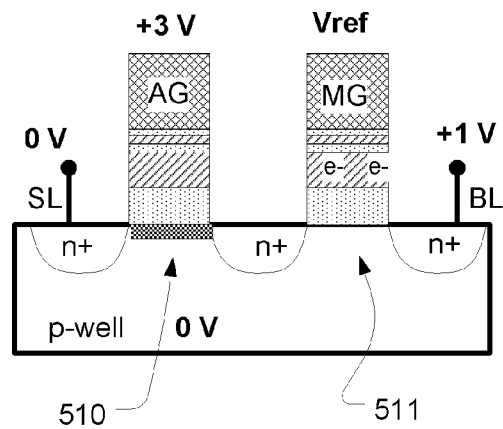
Fig. 28 – Read High Vt
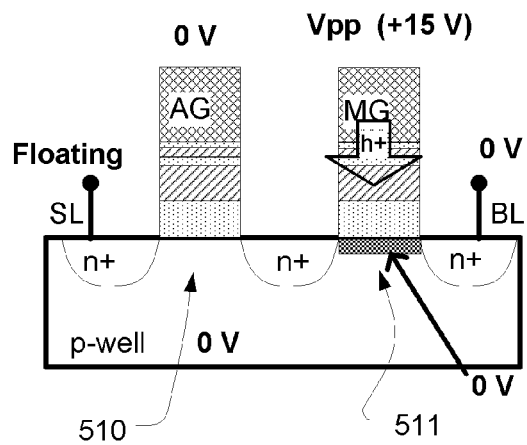
Fig. 29 – +FN Program
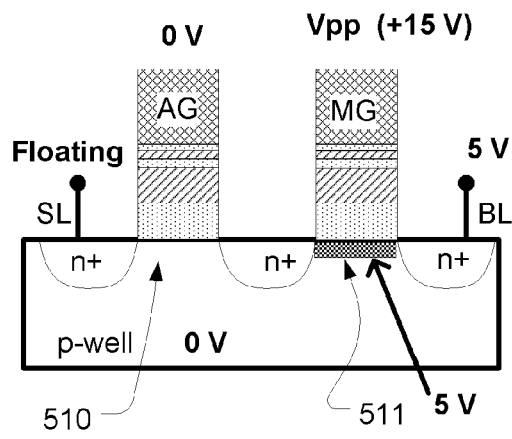
Fig. 30 – +FN Unselected Cell
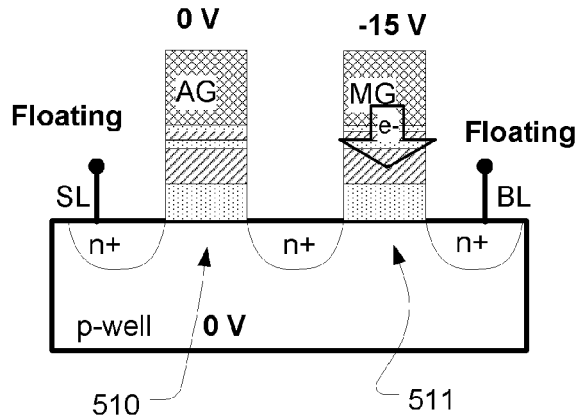
Fig. 31 – –FN Sector Erase

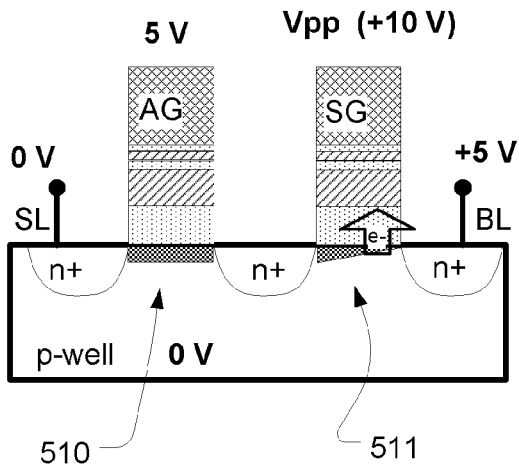
Fig. 32 – CHE Program
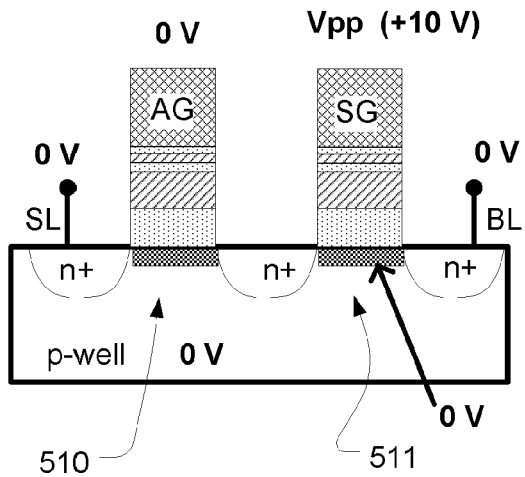
Fig. 33 – CHE Unselected Cell
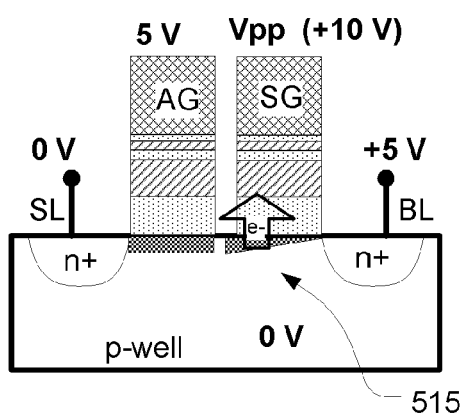
Fig. 34 – CHE Program

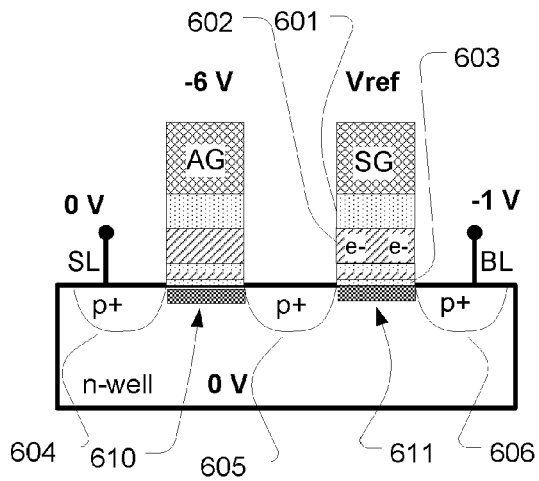
Fig. 35 – Read High Vt
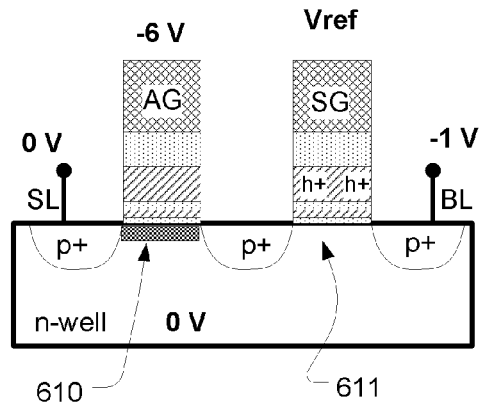
Fig. 36 – Read Low Vt
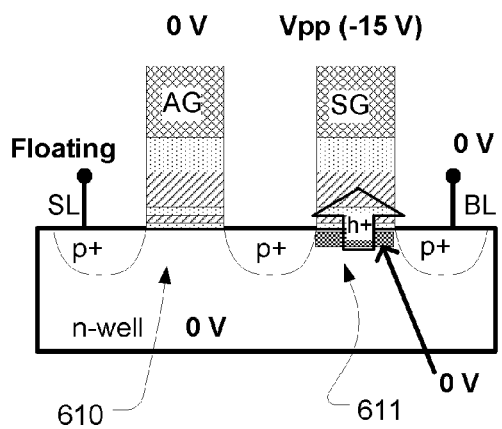
Fig. 37 – +FN Program
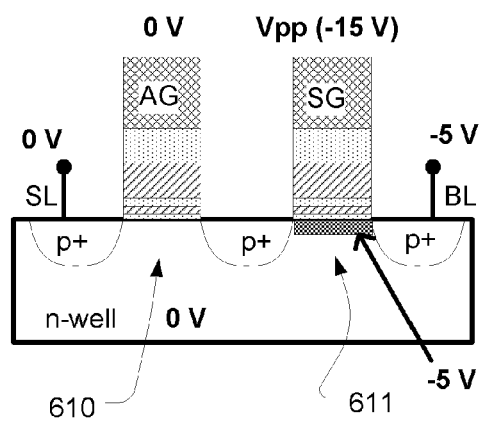
Fig. 38 – +FN Unselected Cell
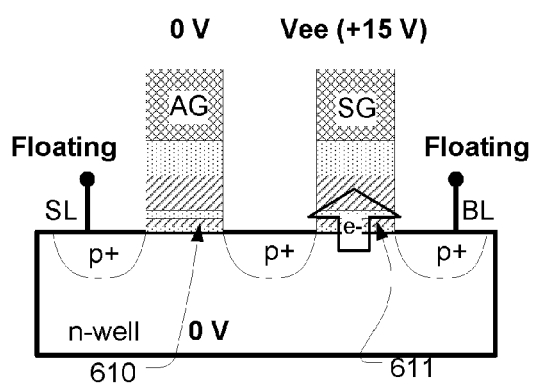
Fig. 39 – – FN Sector Erase

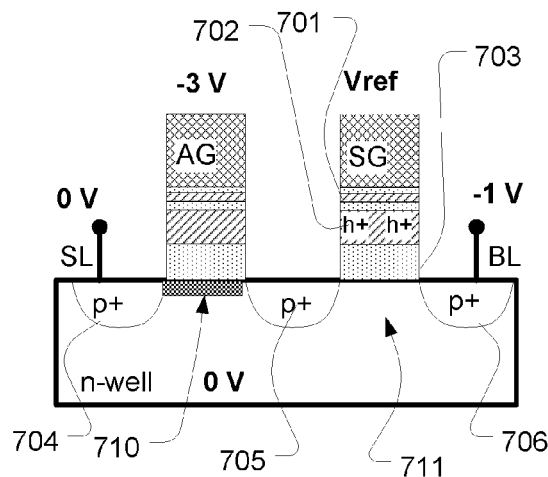
Fig. 40 – Read Low Vt
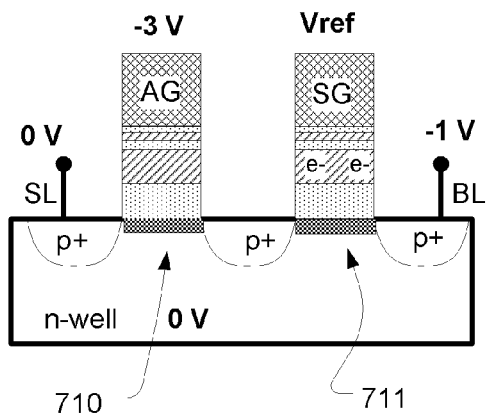
Fig. 41 – Read High Vt
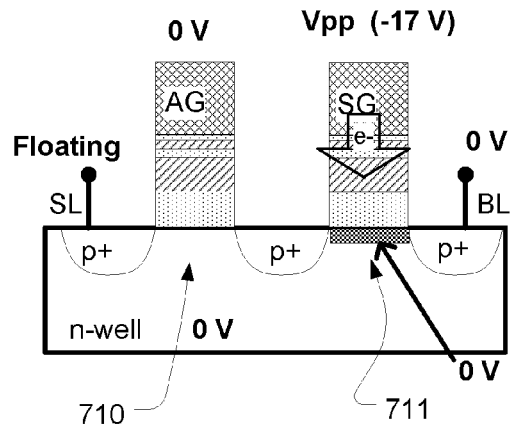
Fig. 42 – – FN Program
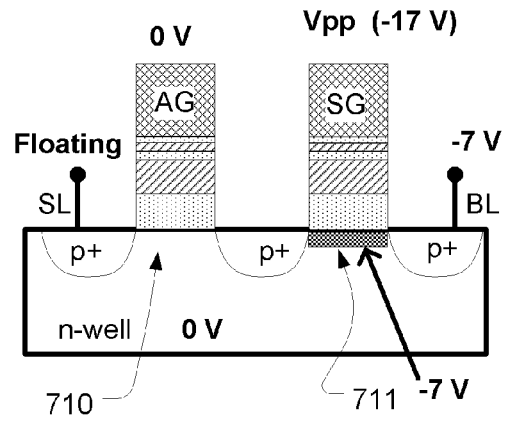
Fig. 43 – – FN Unselected Cell
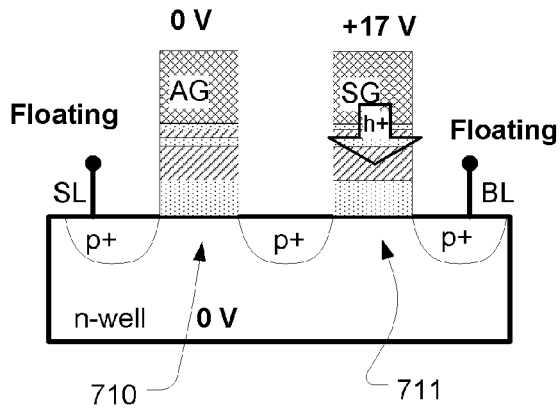
Fig. 44 – + FN Sector Erase

BANDGAP ENGINEERED CHARGE TRAPPING MEMORY IN TWO-TRANSISTOR NOR ARCHITECTURE

BACKGROUND OF THE INVENTION

1. Field of the Invention

The present invention relates to flash memory technology, and more particularly to charge trapping memory technology adaptable for high speed erase and program operations and suitable for use as embedded memory in large scale integrated circuits.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical charge trapping memory cell consists of a field effect transistor FET structure having a source and drain separated by a channel, and a gate separated from the channel by a stack of dielectric material including a tunneling dielectric layer, the charge storage layer, and a blocking dielectric layer. According to the early conventional designs referred to as SONOS devices, the source, drain and channel are formed in a silicon substrate (S), the tunneling dielectric layer is formed of silicon oxide (O), the charge storage layer is formed of silicon nitride (N), the blocking dielectric layer is formed a silicon oxide (O), and the gate comprises polysilicon (S). The SONOS device is programmed by electron tunneling using one of a number of well-known biasing technologies, and erased by hole tunneling or electron de-trapping. In order to achieve practical operational speeds for the erase operation, the tunneling dielectric layer must be quite thin (less than 30 Å). However at that thickness, the endurance and charge retention characteristics of the memory cell are poor relative to traditional floating gate technology. Also, with relatively thick tunneling dielectric layers, the electric field required for the erase operation also causes electron injection from the gate through the blocking dielectric layer. This electron injection causes an erase saturation condition in which the charge level in the charge trapping device converges on an equilibrium level. See, U.S. Pat. No. 7,075,828, entitled "Operation Scheme with Charge Balancing Erase for Charge Trapping Non-Volatile Memory", invented by Lue et al. However, if the erase saturation level is too high, the cell cannot be erased at all, or the threshold margin between the programmed and erased states becomes too small for many applications.

One focus of investigation for charge trapping memory cells has been on NAND style architectures. See, for example, Shin et al., "A Highly Reliable SONOS-type NAND Flash Memory Cell with Al₂O₃ or Top Oxide," IEDM, 2003 (MANOS); and Shin et al., "A Novel NAND-type MONOS Memory using 63 nm Process Technology for a Multi-Gigabit Flash EEPROMs", IEEE 2005.

In a NAND style architecture, the memory cells are arranged in series so that current used for reading data passes through a string of memory cells which limits the amount of current and the speed at which the read operation can be accomplished.

An alternative architecture used in floating gate memory devices that are designed for higher speed read applications is known as the NOR architecture. In a NOR architecture, the memory cells are arranged in parallel between local bit lines and reference lines. In this way, the current during a read operation can be relatively high. However, any leakage current from the cells along a given bit line can interfere with the ability to successfully read the data. Thus, some NOR architecture devices are arranged in a two-transistor (2T) cell structure, where each memory cell includes an access transistor and a data storage transistor connected in series. The access transistor can be used to isolate the data storage transistor from the bit line and prevent leakage from interfering with the reading of other cells.

An example 2T NOR architecture is shown in FIG. 1, which is similar to that described in Tao, et al., "A Quantitative Study of Endurance Characteristics and Its Temperature Dependence of Embedded Flash Memories With 2T-FNFN NOR Device Architecture," IEEE TRANSACTIONS ON DEVICE MATERIALS RELIABILITY, Volume 7, No. 2, June, 2007. According to this prior art technology, an array includes a plurality of access gate word lines AG1, AG2, . . . , and a plurality of memory gate word lines MG1, MG2, . . . , arranged orthogonally relative to a plurality of bit lines BL1, BL1, . . . A unit memory cell includes an access transistor 10 and a floating gate memory transistor 11. An access gate word line (e.g. AG2) is coupled to the gate of the access transistors in a row, and a memory gate word line (e.g., MG2) is coupled to the control gate of the floating gate transistors along the row. The source of the access transistor 10 is coupled to the reference line SL. The drain of the floating gate transistor 11 is coupled to the bit line (e.g. BL1). The access transistor 10 and a floating gate transistor 11 share a terminal between them, acting as the source of the floating gate transistor 11 in the drain of the access transistor 10. As can be seen, in this architecture two unit cells share a bit line contact 12 and are arranged in mirror image on either side of the shared bit line contact 12. The source line SL can be arranged generally in parallel with the access gate word lines as shown.

FIG. 2 illustrates the basic two transistor cell for floating gate implementations. The structure is formed on the semiconductor body 20, which is typically an isolated p-type well on a chip. The memory transistor in the cell includes a control gate 21 (coupled to a memory gate word line), and a floating gate 22 which are made using polysilicon in separate deposition and patterning steps. The floating gate 22 is separated from the semiconductor body 20 by a tunnel dielectric 23 which is typically a silicon dioxide layer. The floating gate is isolated from the control gate 21 by an inter-poly-dielectric 24, which is typically implemented using an oxide/nitride/oxide structure designed to block charge leakage caused by tunneling between the control gate and the floating gate. The access transistor includes an access gate 25 and a gate dielectric layer 26 over the semiconductor body 20. A drain terminal 27 is implemented using an n+doped region, and coupled to a bit line as shown in FIG. 1. Source region 29 implemented using an n+doped region on the opposite side of the access transistor is coupled to the source line SL of the array as shown in FIG. 1. A terminal 28 implemented using an n+ doped region between memory transistor and access transistor acts as the source for the memory transistor and as the drain for the access transistor. Problems associated with the use of floating gate memory devices, including the need to use, and associated costs of, two separate polysilicon deposition steps. Also, problems arise as the size of the devices shrinks with interference between adjacent cells. These issues have prevented its widespread use for embedded memory on large system-on-a-chip, high density devices.

A similar 2T NOR architecture is described in U.S. Pat. No. 5,319,229 by Shimoji et al Shimoji et al. proposes the use of a charge trapping memory cell, which is programmed and erased at relatively low voltages, in combination with an access transistor. The Shimoji et al. cell, because of its low voltage operation during programming and erasing, is likely to suffer problems with disturbance of the charge stored in the memory transistor even at low voltages used for driving the access transistors.

The present inventor has been involved in the development a charge trapping memory using bandgap engineered charge trapping technology, referred to as BE-SONOS. A variety of embodiments of BE-SONOS memory cells can be seen in U.S. Pat. No. 7,426,140 B2 by Lue, and in U.S. Patent Application Publication No. US2007/0029625 by Lue et al. BE-SONOS is characterized by the ability to block charge tunneling at relatively low electric fields, while enabling very efficient tunneling at moderately high electric fields. BE-SONOS also has very good endurance and reliability characteristics.

It is desirable to provide for an embedded memory usable in large-scale system-on-a-chip devices, operable at relatively low voltage, which allows for high speed read access, which has a relatively small footprint on the device, and which is simple to manufacture.

SUMMARY OF THE INVENTION

A 2T cell NOR architecture based on the use of BE-SONOS for embedded memory is described herein.

An integrated circuit device, based on this architecture comprises a memory array with plural bit lines coupled with corresponding columns of memory cells in the array, plural reference lines, a plurality of access gate word lines coupled to access gates in corresponding rows in the array and a plurality of memory gate word lines coupled to memory gates in corresponding rows in the array. The memory cells in the array include respective access transistors having access gates and memory transistors having memory gates arranged in series between the corresponding bit lines and one of the plural reference lines. A memory transistor in a memory cell comprises a semiconductor body including a channel having a channel surface and a charge storing dielectric stack between the memory gate and the channel surface. The dielectric stack comprises a bandgap engineered, tunneling dielectric layer contacting one of the gate (for gate injection tunneling) and the channel surface (for channel injection tunneling). The bandgap engineered, tunneling dielectric layer includes a combination of materials arranged to establish a relatively low valence band energy level near said one of the gate and the channel surface, and an increase in valence band energy level at a first distance from said one of the gate and the channel surface and a decrease in valence band energy at a second distance more than 2 nm from said one of the gate and the channel surface. The dielectric stack of the memory cell also includes a charge trapping dielectric layer between the tunneling dielectric layer having a thickness greater than 5 nm and a blocking dielectric layer between the charge trapping layer and another of the gate and the channel surface. Control circuitry on the integrated circuit includes logic for reading, programming and erasing data stored in the memory cells in the array, taking advantage of the unique characteristics of the 2T NOR memory cell having a BE-SONOS structure, including the characteristic that the tunneling dielectric layer effectively blocks tunneling at relatively low electric fields encountered during operation of the device during read operations, and as an unselected cell during programming and erase, while enabling efficient programming and erase of selected cells or selected sectors, at moderate electric fields.

The 2T NOR architecture enables fast read operations, where parallel connection of the memory cells, and the fact that memory transistor in the memory cells has a terminal in the semiconductor body, with a conductive contact directly connecting the terminal and a bit line, provide for relatively high currents at low operating voltages.

The use of BE-SONOS structures enables memory cells in which the access transistor and the memory transistor both, have the same dielectric stack, including the tunneling dielectric layer, to allow for ease of manufacturing and dense layouts of the array. The ability of the BE-SONOS structure to block tunneling at low electric fields allows the access transistor to operate as a standard field effect device, without trapping charge during the programming and erasing of memory transistor in the same or adjacent cells.

The use of BE-SONOS structures enables "junction-free" embodiments, in which the semiconductor body for a memory cell includes first and second doped terminals separated by a channel region without an intervening junction, in which the memory gate and access gate of a particular memory cell are arranged adjacent to one another and overly the channel region.

In embodiments in which the tunneling dielectric layer is adjacent the channel surface, the control circuitry is arranged to program memory cells in the array to a high threshold state by FN electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

In embodiments in which the tunneling dielectric layer is adjacent the memory gate, the control circuitry is arranged to program the memory cells to a low threshold state by FN hole injection tunneling from the gate across the tunneling dielectric layer to the charge trapping layer and arranged to erase the memory cells to a high threshold state by FN electron tunneling from the gate across the tunneling dielectric layer to the charge trapping layer.

In alternatives for both gate injection and channel injection embodiments, the control circuitry is arranged to induce channel hot electron programming. In alternatives of the channel hot electron programming devices, the access transistor can be biased to act as a current limiting device, improving performance and reducing power consumption during programming in this manner.

The large operating window possible using BE-SONOS structures enables embodiments storing multiple bits per cell.

Both n-channel and p-channel embodiments are described herein.

Other aspects and advantages of the present invention can be seen on review of the drawings, the detailed description and the claims, which follow.

BRIEF DESCRIPTION OF THE DRAWINGS

FIGS. 14 and 15 illustrate the biasing arrangements for reading a 2T cell using n-channel, channel injection, BE-SONOS memory transistors.

FIGS. 16 and 17 illustrate the biasing arrangements applied during programming to a selected cell and to an unselected cell, respectively, during FN electron tunneling programming of the selected cell using n-channel BE-SONOS memory transistors.

FIGS. 18 illustrates the biasing arrangements for a FN hole tunneling sector erase in a NOR architecture using a 2T cell with n-channel BE-SONOS memory transistors.

FIGS. 19 and 20 illustrate the biasing arrangements for a selected cell and an unselected cell, respectively, during FN electron tunneling programming of the selected cell using n-channel BE-SONOS memory transistors, using low magnitude voltages.

FIGS. 21 and 22 illustrate the biasing arrangements for a selected cell and an unselected cell, respectively, during channel hot electron injection programming of the selected cell using n-channel BE-SONOS memory transistors, using low magnitude voltages.

FIGS. 27 and 28 illustrate the biasing arrangements for reading a 2T cell using n-channel, gate injection, BE-SONOS memory transistors.

FIGS. 29 and 30 illustrate the biasing arrangements for a selected cell and an unselected cell, respectively, during FN electron tunneling programming of the selected cell using n-channel, gate injection BE-SONOS memory transistors.

FIG. 31 illustrates the biasing arrangements for a FN electron tunneling sector erase in a NOR architecture using a 2T cell with n-channel, gate injection BE-SONOS memory transistors.

FIGS. 32 and 33 illustrate the biasing arrangements for a selected cell and an unselected cell, respectively, during channel hot electron injection programming of the selected cell using n-channel, gate injection BE-SONOS memory transistors.

FIG. 34 illustrates the biasing arrangement for a selected cell during channel hot electron injection programming in a junction-free 2T cell, having a n-channel, a gate injection BE-SONOS memory transistors.

FIGS. 35 and 36 illustrate the biasing arrangements for reading a 2T cell using p-channel, channel injection, BE-SONOS memory transistors.

FIGS. 37 and 38 illustrate the biasing arrangements for a selected cell and an unselected cell, respectively, during FN electron tunneling programming of the selected cell using p-channel, channel injection BE-SONOS memory transistors.

FIG. 39 illustrates the biasing arrangements for a FN electron tunneling sector erase in a NOR architecture using a 2T cell with p-channel, channel injection BE-SONOS memory transistors.

FIGS. 40 and 41 illustrate the biasing arrangements for reading a 2T cell using p-channel, gate injection, BE-SONOS memory transistors.

FIGS. 42 and 43 illustrate the biasing arrangements for a selected cell and an unselected cell, respectively, during FN electron tunneling programming of the selected cell using p-channel, gate injection BE-SONOS memory transistors.

FIG. 44 illustrates the biasing arrangements for a FN electron tunneling sector erase in a NOR architecture using a 2T cell with p-channel, gate injection BE-SONOS memory transistors.

DETAILED DESCRIPTION

A detailed description of embodiments of the present invention is provided with reference to the FIGS. 3-45.

Figure 3:
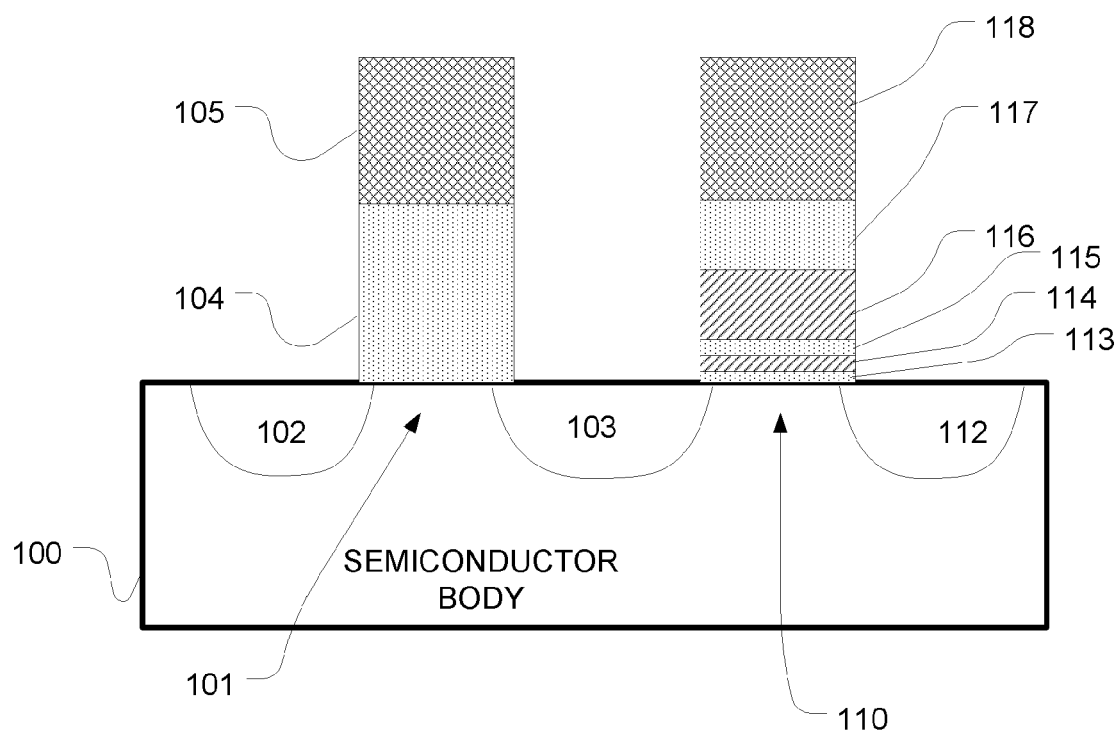
FIG. 3 is a cross-section 2T memory cell based on a channel injection, BE-SONOS memory transistor.

FIG. 3 is a simplified diagram of a 2T cell including charge trapping memory transistors employing a bandgap engineered dielectric tunneling layer. The memory cell is formed on a semiconductor body 100, and includes an access transistor and memory transistor. The access transistor includes a channel 101, a source 102 and a drain in terminal 103. A gate dielectric layer 104 overlies the channel 101, and a gate 105 overlies the gate dielectric 104. The memory transistor includes a channel 110, a source in terminal 103 and a drain 112 adjacent the channel. A gate 118 overlies a multilayer stack of dielectric materials acting as the charge storage structure, including a blocking dielectric layer, a charge trapping layer and a tunneling layer. In this example, the charge trapping layer is in contact with the tunneling layer, but can be otherwise disposed between the tunneling layer and the gate. Likewise, the blocking layer in this example is in contact with the charge trapping layer, but can be otherwise disposed between the charge trapping layer and the gate.

Gates 105 and 118 in this embodiment comprise p+ polysilicon. N+ polysilicon may also be used. Other embodiments employ metals, metal compounds or combinations of metals and metal compounds, particularly for the gate 118, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 3, the dielectric tunneling layer comprises a composite of materials, including a first layer 113, referred to as a hole tunneling layer, of silicon dioxide on the surface of the channel 110 formed for example using in-situ steam generation ISSG with optional nitridation by either a post deposition NO anneal or by addition of NO to the ambient during deposition. The thickness of the first layer 113 of silicon dioxide is less than 20 Å, and preferably 15 Å or less. Representative embodiments are 10 Å or 12 Å thick.

A layer 114, referred to as a band offset layer, of silicon nitride lies on the first layer 113 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 114 of silicon nitride is less than 30 Å, and preferably 25 Å or less.

A second layer 115 of silicon dioxide, referred to as an isolation layer, lies on the layer 114 of silicon nitride formed for example using LPCVD high temperature oxide HTO deposition. The thickness of the second layer 115 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling dielectric after the first location. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=15 Å), an ultrathin silicon nitride layer Ni (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

The structure of the dielectric tunneling layer is described in more detail below with reference to FIGS. 10 and 11.

A charge trapping layer 116 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer 117 in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$.

In a representative embodiment, the first layer 113 can be 13 Å of silicon dioxide; the band offset layer 114 can be 20 Å of silicon nitride; the isolation layer 115 can be 25 Å of silicon dioxide; the charge trapping layer 116 can be 70 Å of silicon nitride; and the blocking dielectric layer 117 can be of silicon oxide 90 Å thick. The gate material can be p+ polysilicon (work function about 5.1 eV).

Figure 1:
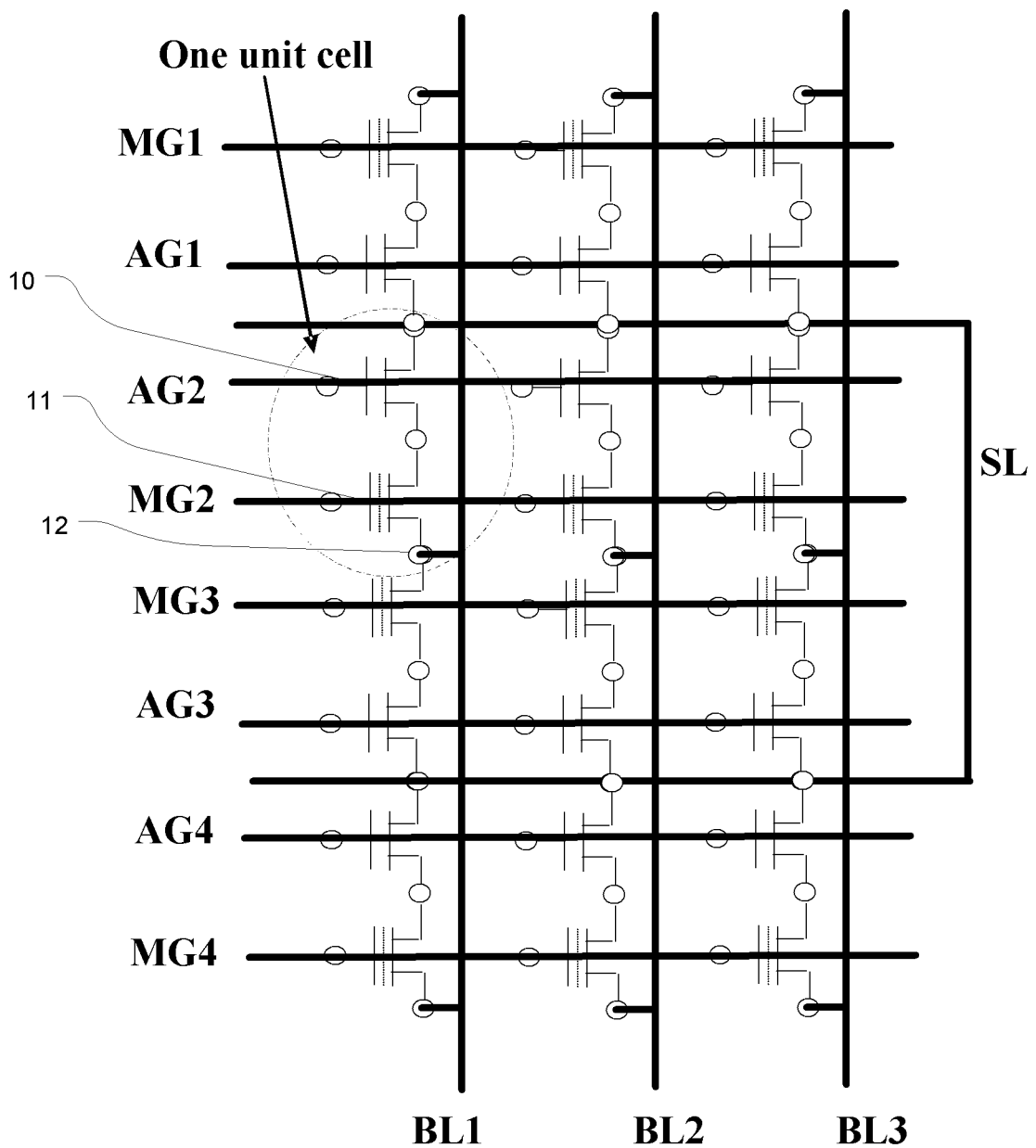
FIG. 1 is a schematic diagram of a prior art 2T NOR architecture memory array using nonvolatile, floating gate memory transistors.
Figure 2:
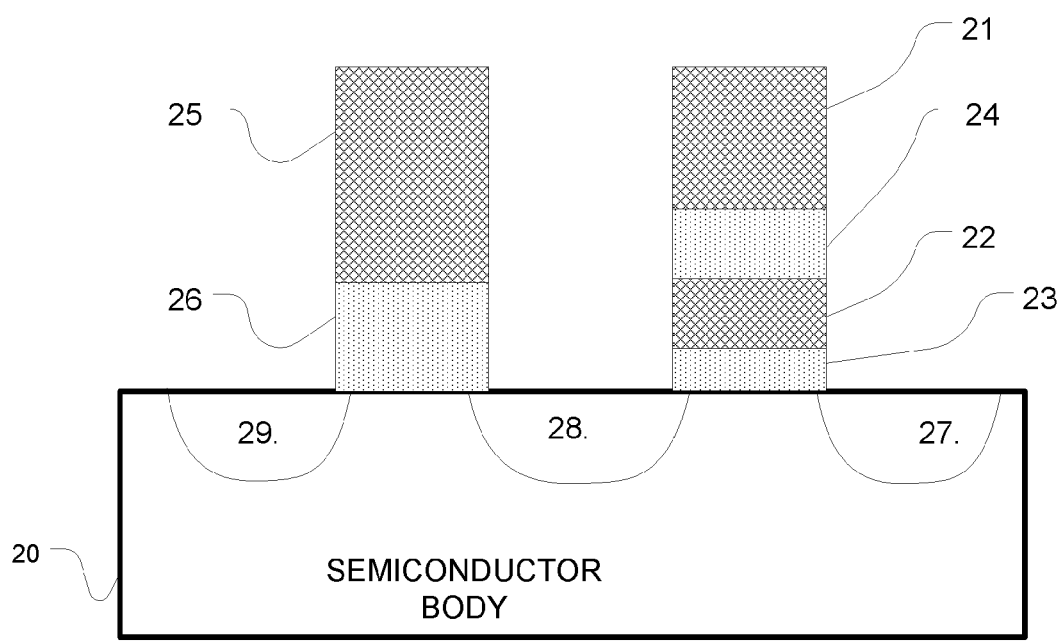
FIG. 2 is a cross-section of a prior art 2T memory cell based on a floating gate memory transistor.
Figure 4:
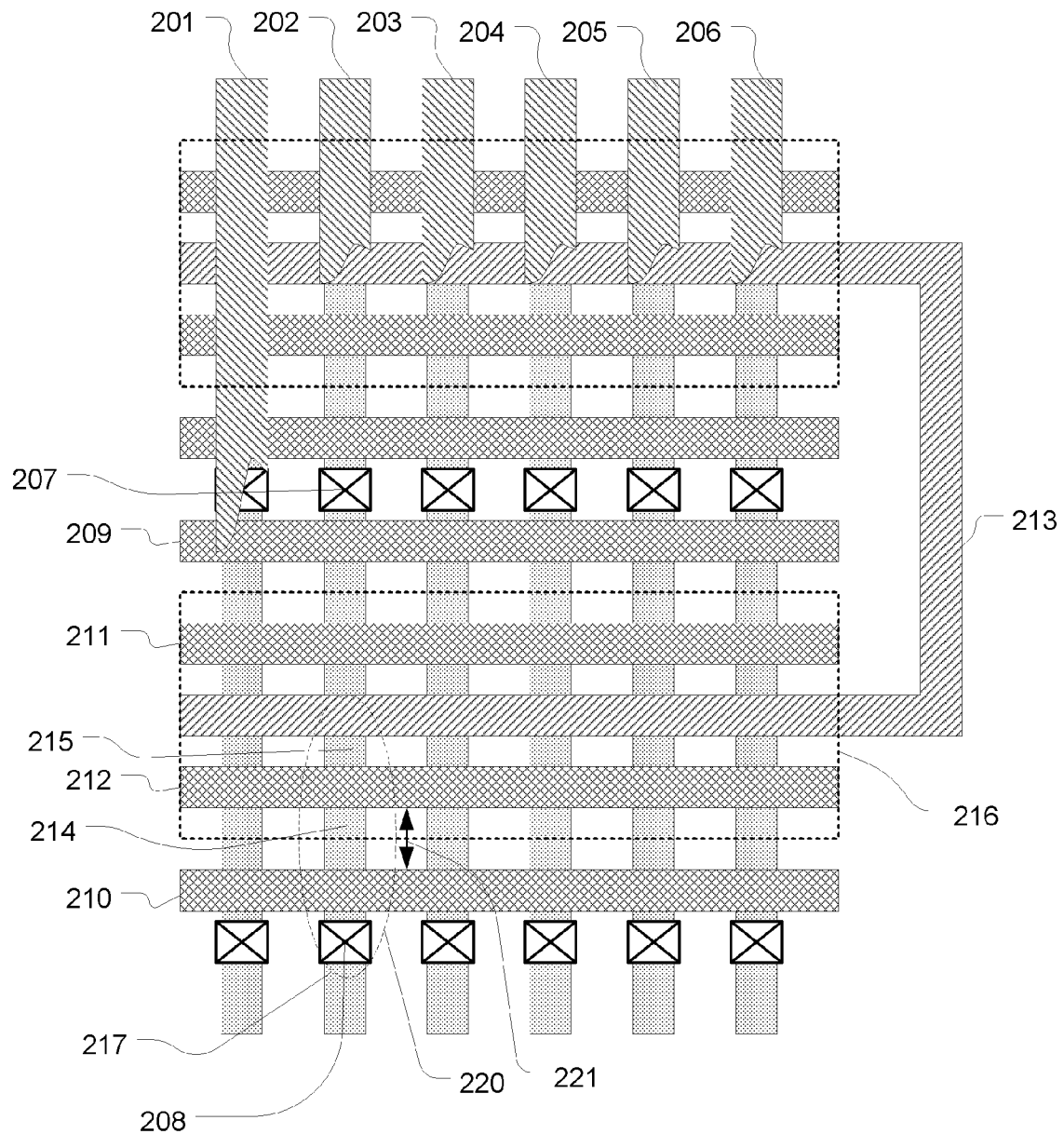
FIG. 4 is a layout view for an array structure using the 2T memory cell shown in FIG. 3.

FIG. 4 provides a layout view of a 2T NOR architecture embedded memory, using the memory cell structure of FIG. 3. A top layer in the layout includes patterned metal lines 201-206 which are connected as bit lines for the array, corresponding with bit lines BL1-BL3 of FIG. 1. The patterned metal lines 201-206 are "peeled-back" in this view in order to show details of the underlying layers, but extend along the length of the array. The patterned metal lines 201-206 are connected through vias in interlayer dielectrics by contacts (e.g. contact 207 and contact 208 on metal line 202), to doped regions (e.g. region 217) in the semiconductor substrate which act as the drain regions for memory transistors in the memory cells. Polysilicon lines are arranged orthogonal to the patterned metal lines 201-206 to provide memory gate word lines (e.g. 209, 210) and access gate word lines (e.g. 211, 212). A patterned metal line 213 acts as the source line for the array, corresponding with the source line SL in FIG. 1. The patterned metal line 213 is coupled to underlying doped regions (e.g. region 215) in the semiconductor substrate which act as the source regions for the access transistors in the memory cells by contacts (not shown). Doped regions (e.g. region 214) between access gate word lines and memory word lines provide junctions between the access transistors and the memory transistors, as described above. One unit memory cell is identified by the circle 220 in the layout, including an access transistor and a memory transistor coupled in series between the patterned metal line 213 acting as the source line and the patterned metal line 202 acting as a bit line. The order of the access transistor and the memory transistor in the unit cell can be reversed in alternative embodiments, so that the memory transistor is coupled at its source to the source line, and the access transistor is coupled at its drain to the bit line.

In the illustrated embodiment, the gate dielectric (104 in FIG. 3) in the access transistors is implemented with a single layer of silicon dioxide or other appropriate gate dielectric material. However, the memory transistors have a dielectric stack (117-113 in FIG. 3) that includes the charge trapping structures as described above. Therefore, in the manufacturing of the device, a pattern step represented by the rectangle 216 is used to allow for creating the different types of dielectric stacks between the polysilicon and the substrate. Because this pattern step is required, the distance (e.g. 221) between a memory gate word line 210 and the access gate word line 212 must be large enough to account for mask misalignments.

Figure 5:
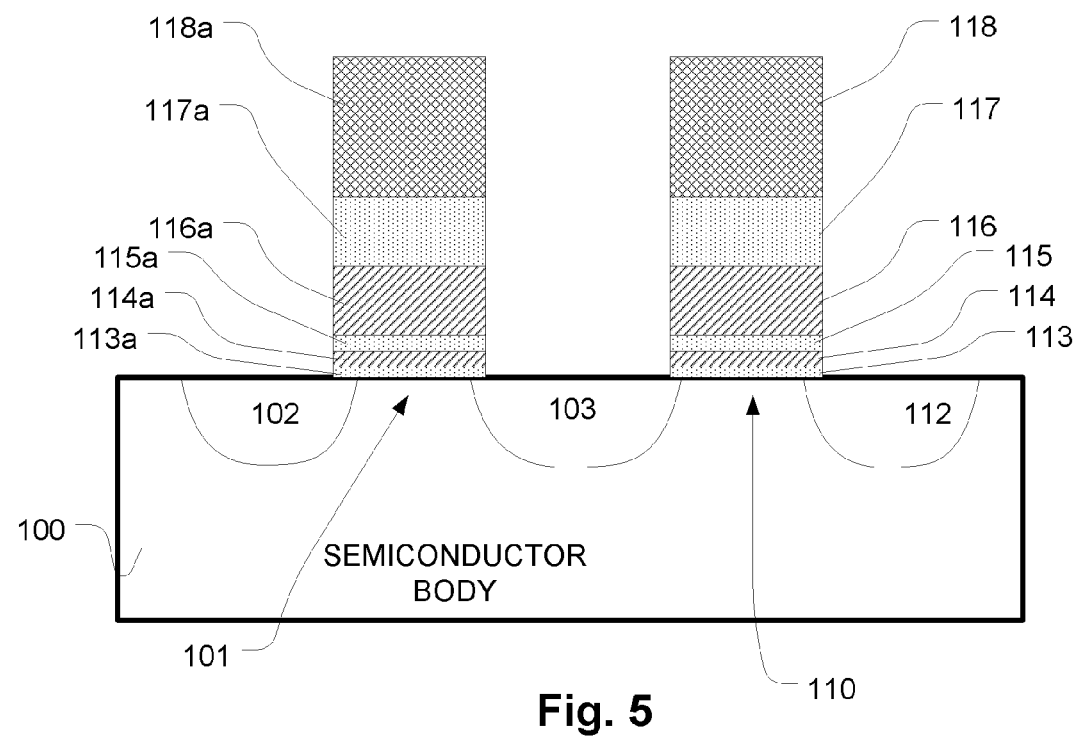
FIG. 5 is a cross-section of a 2T memory cell using a channel injection, BE-SONOS transistor for both the access transistor and the memory transistor.

FIG. 5 illustrates an alternative structure for the unit 2T memory cell, in which the gate dielectric of the access transistor is made using the same dielectric stack as that of the memory transistor. As shown in FIG. 4, the access transistor has a gate 118a, a blocking dielectric layer 117a, a charge trapping layer 116a and a tunneling dielectric layer including layers 115a, 114a and 113a. Otherwise, the structure is similar to that of FIG. 3. The structure in FIG. 5 is possible because of the characteristic of the tunneling dielectric layer that it operates as an effective block for charge tunneling at moderate electric fields that are encountered during the operation of the 2T cell. Thus, it behaves as a typical field effect transistor when used in the role of the access transistor of a 2T cell. Also, the structure in FIG. 5 is preferable to that of FIG. 3 because the area required for manufacturing the unit cell is reduced. The reduction in area occurs because there is no need to provide offsets that account for the possibility of misaligned masks that are needed to implement two different types of dielectric stacks within the 2T cell.

Figure 6:
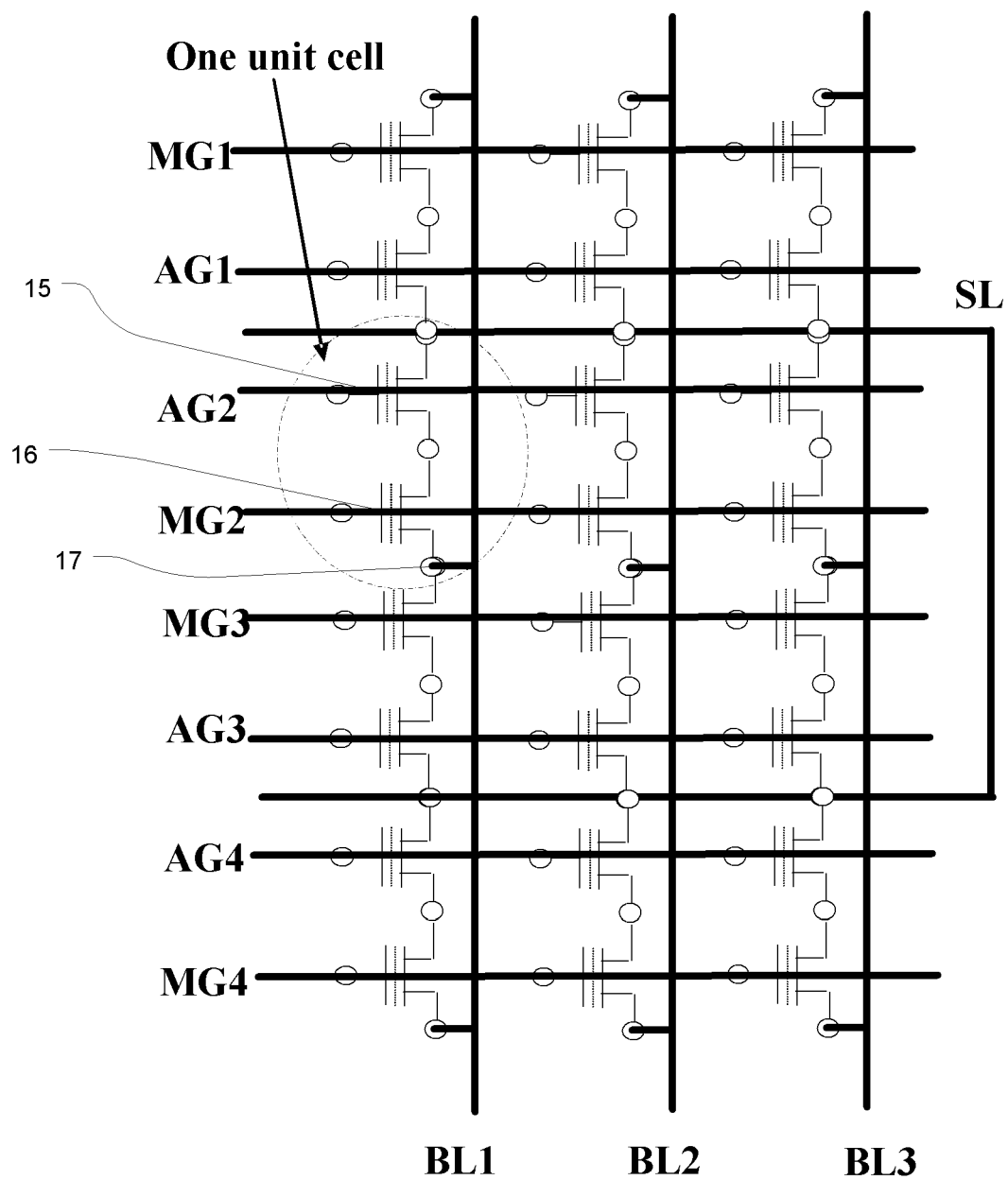
FIG. 6 is a schematic diagram of a prior art 2T NOR architecture memory array using BE-SONOS memory transistors laid out as shown in FIG. 5.

FIG. 6 is a schematic diagram of a 2T NOR architecture memory array, utilizing the cell structure of FIG. 5. As can be seen, the layout in FIG. 6 is like the prior art schematic of FIG. 1, with the exception that the access transistors are implemented using a non-volatile memory cell structure that is the same structure used for the memory cells. A unit memory cell in the layout of FIG. 6 includes an access transistor 15, having a BE-SONOS dielectric stack acting as the gate dielectric, and a BE-SONOS memory transistor 16 in which the BE-SONOS dielectric stack is used for storing data. An access gate word line (e.g. AG2) is coupled to the gate of the access transistors in a row, and a memory gate word line (e.g., MG2) is coupled to the control gate of the floating gate transistors along the row. The source of the access transistor 15 is coupled to the reference line SL. The drain of the memory transistor 16 is coupled to the bit line (e.g. BL1). The access transistor 15 and memory transistor 16 share a terminal between them, acting as the source of the memory transistor 16 in the drain of the access transistor 15. As can be seen, in this architecture two unit cells share a bit line contact 17 and are arranged in mirror image on either side of the shared bit line contact 17. The source line SL can be arranged generally in parallel with the access gate word lines as shown.

Figure 7:
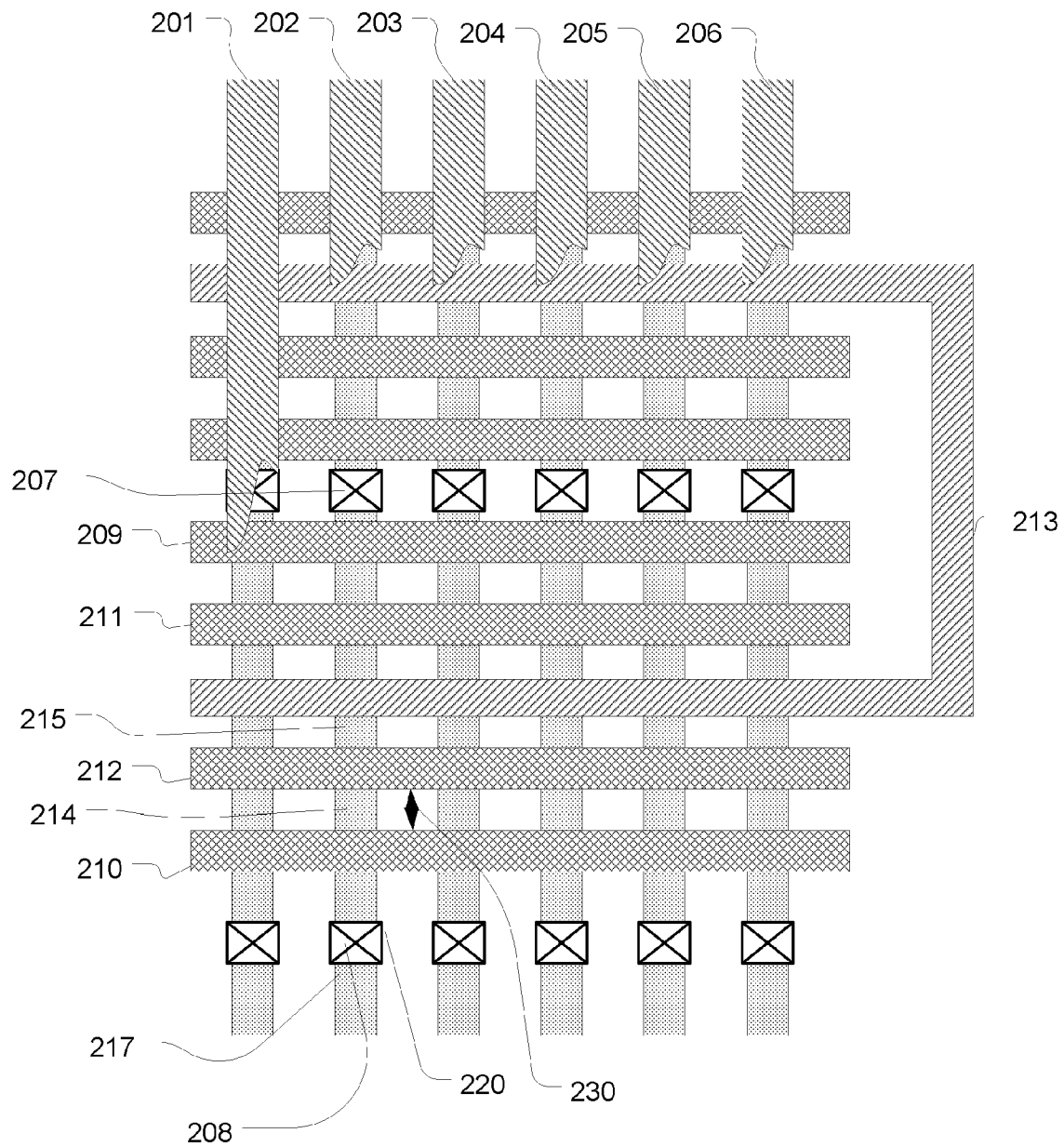
FIG. 7 is a layout view for an array structure using the 2T memory cell shown in FIG. 5.

FIG. 7 provides a layout view of a 2T NOR architecture embedded memory, using the memory cell structure of FIG. 5. As the structure is similar, the same reference numerals are applied in this figure as are used in FIG. 4. However, layout pattern 216 is not necessary for the structure shown in FIG. 7 because the dielectric stack under the access gate word lines (e.g. 211, 212) is the same as the dielectric stack beneath the memory gate word lines (e.g. 210, 209). Therefore the distance represented by the arrow 230 between me memory gate word line 210 and the access gate word line 212 is significantly reduced, resulting in a smaller overall array footprint.

Figure 8:
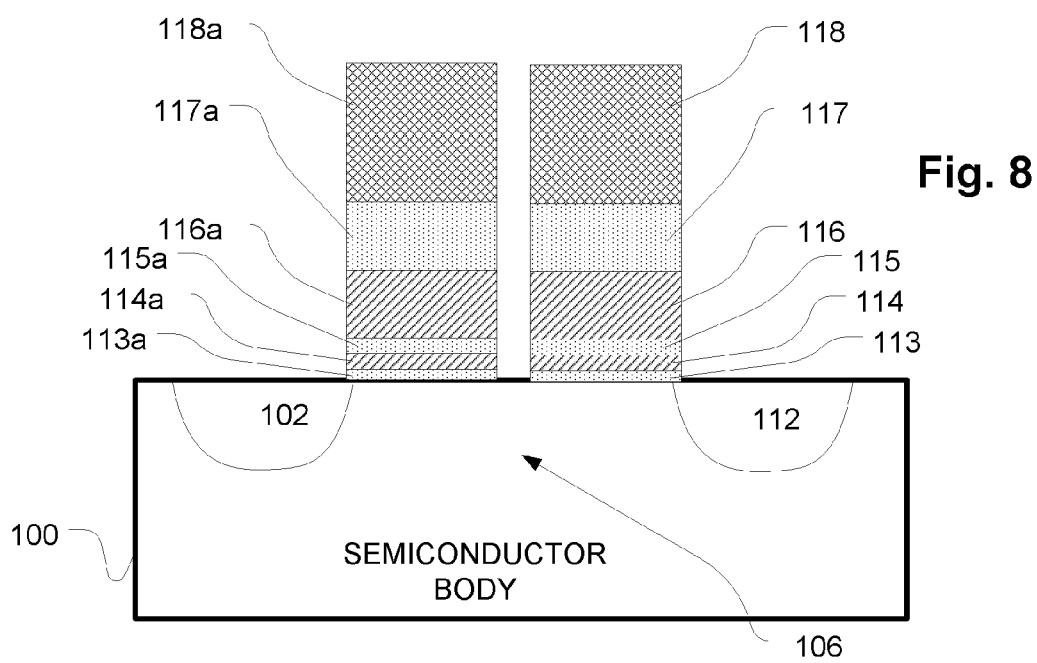
FIG. 8 is a cross-section of a "junction-free" 2T memory cell using a channel injection, BE-SONOS transistor for both the access transistor and the memory transistor, without a doped terminal to provide a junction between the access transistor and the memory transistor.

FIG. 8 illustrates an even higher density alternative structure for the unit 2T memory cell, using any "junction-free" structure. The 2T cell of FIG. 5 is implemented with the gate dielectric of the access transistor is made using the same dielectric stack as that of the memory transistor like and FIG. 5. The same reference numerals are applied to the layers to emphasize the similar structure. However, there is no intergate doped region (103 in FIG. 5) found in the structure of FIG. 8. Rather, a continuous channel region 106 extends between the source terminal 102 and the drain terminal 112.

Figure 9:
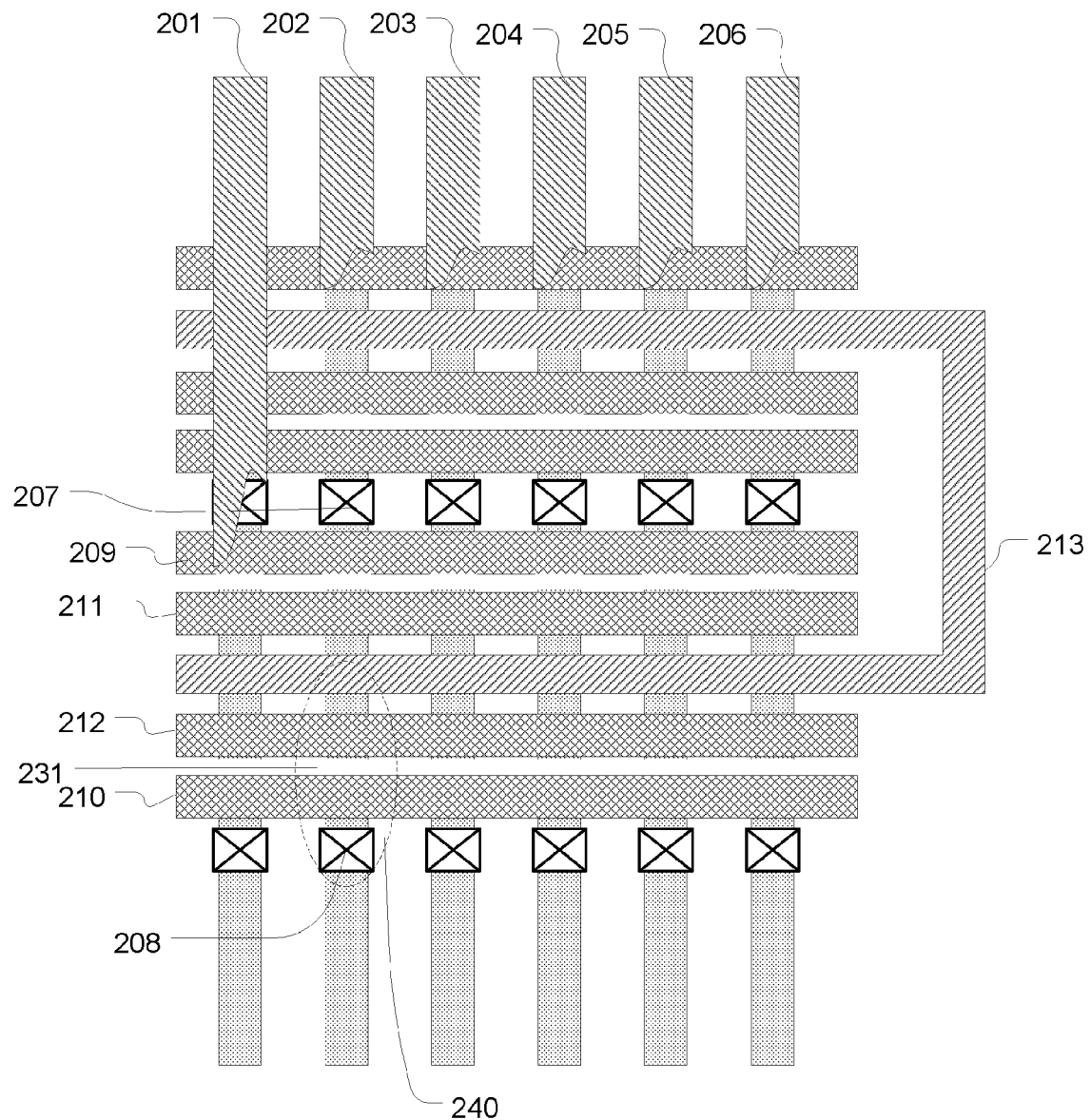
FIG. 9 is a layout view for an array structure using the 2T memory cell shown in FIG. 5.

FIG. 9 provides a layout view of a 2T NOR architecture embedded memory, using the memory cell structure of FIG. 8. As the structure is similar to that of FIGS. 4 and 7, the same reference numerals are applied in this figure as are used in FIGS. 4 and 7. However, layout pattern 216 is not necessary for the structure shown in FIG. 9 because the dielectric stack under the access gate word lines (e.g. 211, 212) is the same as the dielectric stack beneath the memory gate word lines (e.g. 210, 209). Also, the regions (e.g. region 231) in the substrate between the access gate word lines and the memory gate word lines does not include a doped region, and is rather junction free as explained above. Therefore, the unit cell 240 and the distance between me memory gate word line 210 and the access gate word line 212 can be very small, resulting in a smaller overall array footprint.

Figure 10:
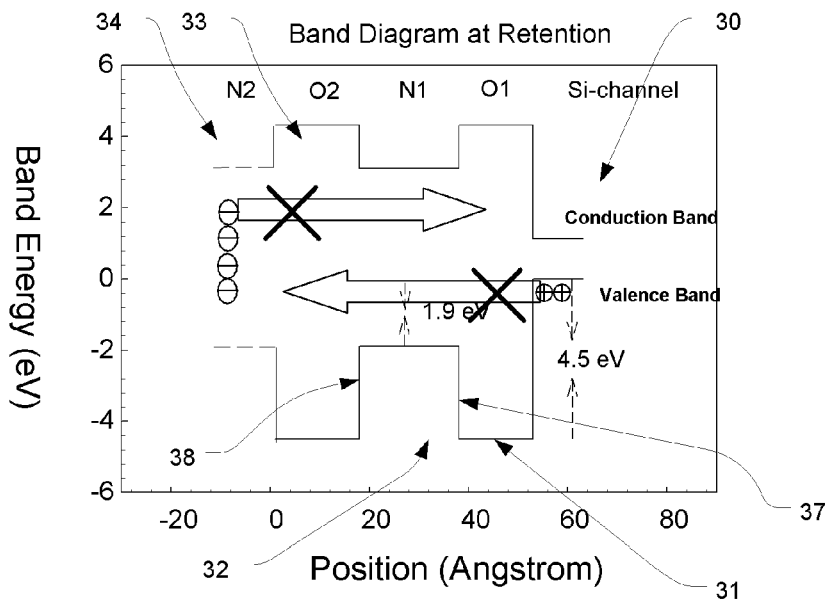
FIG. 10 is a band diagram showing the behavior of the multilayer tunneling dielectric in a BE-SONOS memory transistor under low electric field.

FIG. 10 is a diagram of the energy levels of the conduction and valence bands of the dielectric tunneling structure including the stack of layers 113-115 of FIG. 3 under a low electric field, showing a "U-shaped" conduction band and an "inverted U-shaped" valence band. From the right side, the bandgap for the semiconductor body is shown in region 30, the valence and conduction bands for the hole tunneling layer 113 are shown in region 31, the bandgap for the offset layer 114 is shown in region 32, the valence and conduction bands for the isolation layer 115 are shown in region 33 and the valence and conduction bands for the charge trapping layer 116 are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2 nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 11:
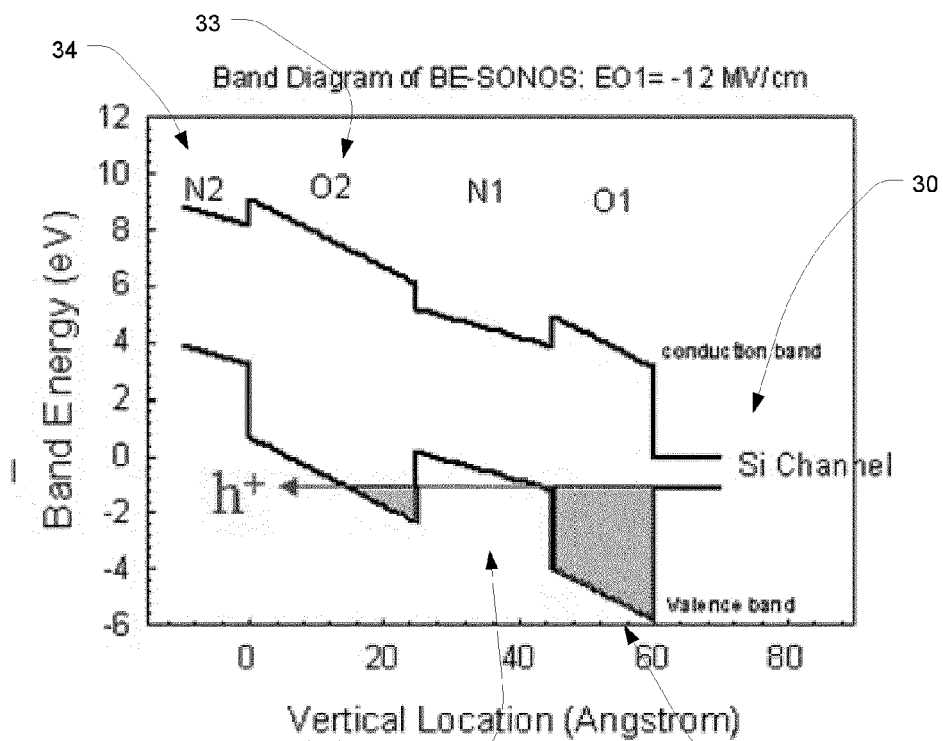
FIG. 11 is a band diagram showing the behavior of the multilayer tunneling dielectric in a BE-SONOS memory transistor under high electric field for hole tunneling.

FIG. 11 shows the band diagram for the dielectric tunneling structure under conditions of an electric field of about −12 MV/cm in the tunneling region 31, for the purposes of inducing hole tunneling (in FIG. 3, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 3) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer (region 32) in this embodiment must be thin enough that it 20 has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling layer (region 31), for an embodiment employing silicon dioxide, should be less than 18 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

As a result of the U-shaped valence band and U-shaped conduction band in the dielectric tunneling layer, the tunneling layer acts effectively like a switch which is off allowing essentially no tunneling when the electric field is below a threshold level (for example less than about 8 MV/cm), while allowing highly efficient tunneling when the electric field is above the threshold level. One can think of the threshold as that magnitude of electric field in which the effect of the isolation layer 33 on tunneling probability becomes insignificant or small. Because of the use of BE-SONOS memory transistors, the access transistors and memory transistors can be more densely packed in the layout, because electric fields within the charge trapping structures in the memory transistors, that are induced by voltages on the access transistors gates do not cause sufficient disturbance of the charge trapping the memory cells to affect operation.

Also, 2T NOR architecture like that described above, using BE-SONOS memory transistors and access transistors having the same dielectric stack as the BE-SONOS memory transistors are enabled. Using BS-SONOS memory transistors and access transistors, it becomes possible to operate the access transistors at voltages that do not result in the creation of an electric field above the threshold for the tunneling dielectric layer in the access transistor. In this way, the access transistors do not trap charge in amounts sufficient to change their operating threshold voltages.

Figure 12:
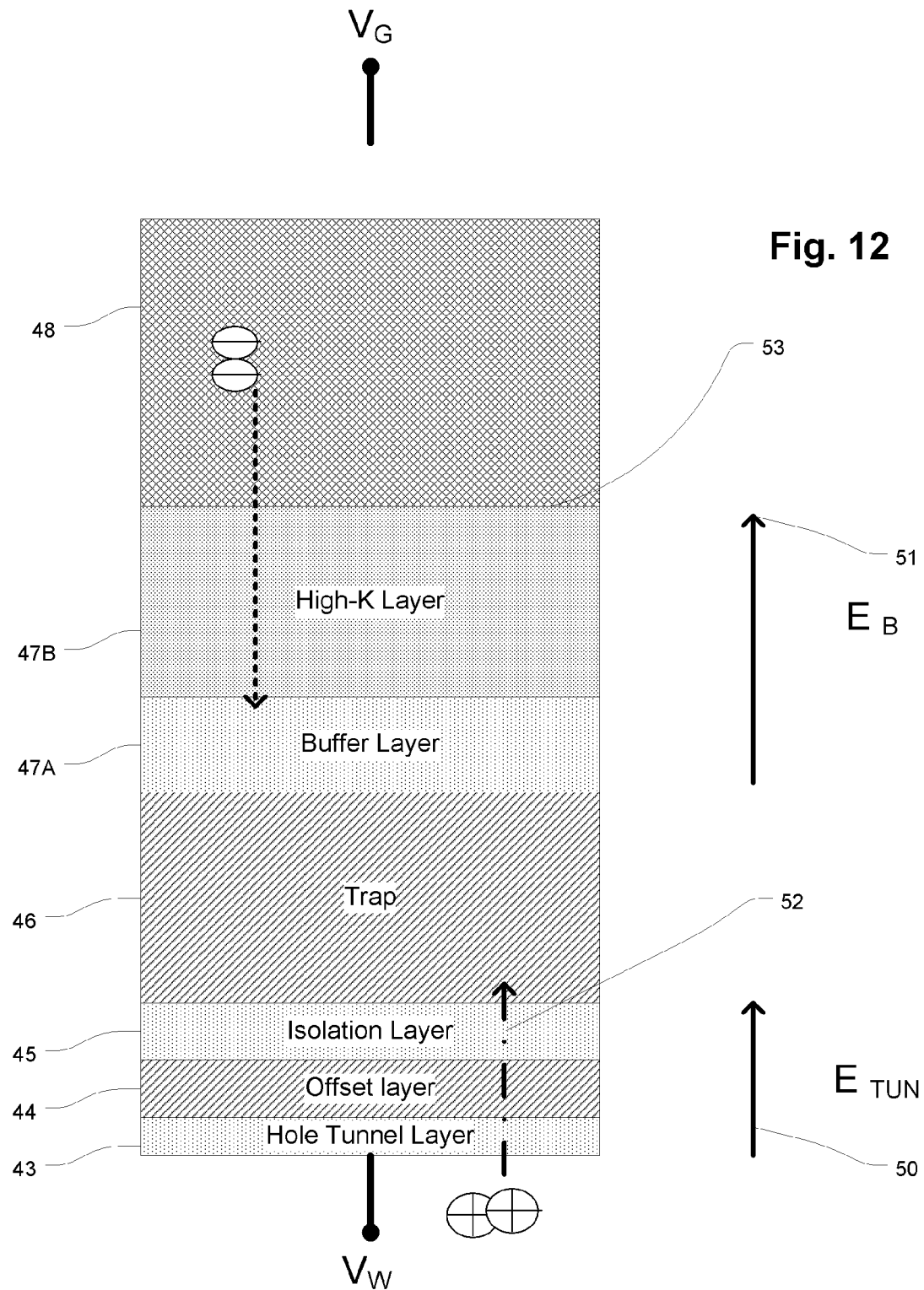
FIG. 12 is a simplified view of the dielectric stack for a BE-SONOS memory transistor suitable for use in the architectures described above.

FIG. 12 is a schematic illustration of the gate stack for one alternative BE-SONOS charge trapping memory transistor suitable for use in the 2T NOR architecture, showing electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer, or otherwise between the tunneling dielectric layer and the gate. A blocking dielectric layer consisting of a multilayer structure including a buffer layer 47A and a capping layer 47B is between and separates the charge trapping layer 46 from the gate 48. During an erase process, the electric field is induced by bias voltages $V_G$ and $V_W$ applied at the gate and channel of the memory cell, and results in an electric field $E_{TUN}$ 50 through the dielectric tunneling layer 43, 44, 45 and an electric field $E_B$ 51 through the blocking layer 47A/47B. The magnitude of the electric field $E_{TUN}$ 50 through the dielectric tunneling layer is sufficient to induce hole tunneling current 52 into the trapping layer 46. The magnitude of the electric field $E_B$ 51 through the capping layer 47B in the blocking dielectric layer is reduced relative to that through the silicon dioxide in the tunneling dielectric layer because of the higher dielectric constant by an amount that is about $3.9/\kappa$, where 3.9 is the dielectric constant for silicon dioxide and $\kappa$ is the dielectric constant of the capping layer 47B. Therefore, because of sufficient electron affinity of the gate 48, the relatively lower electric field $E_B$ 51 and the thickness of the blocking dielectric layer 47A/47B, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

In examples of memory cells described herein, in order to get a reasonable operation speed (program and erase) at a voltage of less than 20 volts, the total effective oxide thickness EOT for the multilayer dielectric stack (e.g., High-k-O—N—O—N—O, and High-k-O—N—O) between the gate and the channel should be less than 160 Å. The EOT of a bandgap engineered (BE) ONO tunneling barrier or a single layer $SiO_2$ tunnel oxide is typically in a range of about 40 to 55 Å, and preferably 45 to 50 Å and the EOT of a nitride charge trapping layer is typically in a range of about 25 to 40 Å, and preferably 30 to 35 Å. Therefore, the EOT for the multilayer blocking dielectric layer (e.g. $SiO_2$ buffer layer and $Al_2O_3$) is less than 95 Å, and preferably in a range of about 75 to 85 Å, for the memory cells described herein.

Figure 13:
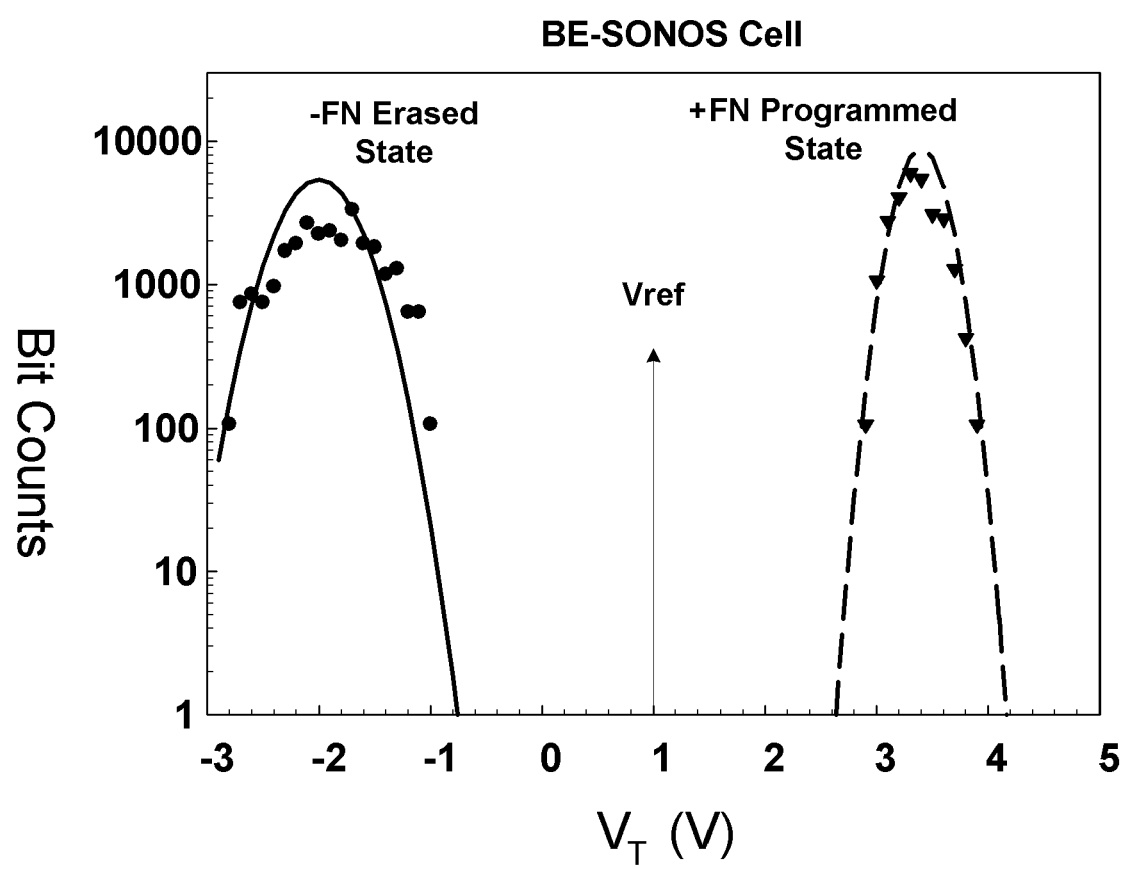
FIG. 13 is a diagram showing a distribution of threshold voltages for BE-SONOS memory transistors in the erased and programmed states.

FIG. 13 is a graph of the number of memory cells ("bit counts") versus threshold voltage for a typical n-channel BE-SONOS memory transistor having the tunnel dielectric structure adjacent the channel, for a programmed state corresponding to a high threshold value induced by Fowler Nordheim electron tunneling with a positive voltage on the gate, and for an erased state corresponding to a low threshold value induced by Fowler Nordheim hole tunneling with the negative voltage on the gate. The voltage Vref labeled in the figure can be used as a word line voltage to distinguish between programmed and erased state transistors. In this example, a suitable Vref is about 1 V, the high threshold state corresponds with threshold voltages greater than about 2.5 V and the low threshold state corresponds with threshold voltages lower than about −1 V.

FIGS. 14-22 illustrate biasing arrangements for memory cells like that shown in FIG. 5, wherein the memory transistors have programmed state and erased state characteristics similar to those shown in FIG. 13. FIG. 14 illustrates a representative biasing arrangement for reading a memory cell, in which the memory transistor has a high threshold state, symbolized in the figure by the "e−" symbols in the charge trapping layer 302. The memory cell shown in FIG. 14 includes an access transistor having access gate AG and a memory transistor having a memory gate MG. The dielectric stack in both the access transistor and the memory transistor includes a blocking dielectric layer 301, a charge trapping layer 302, and a tunneling dielectric layer 303, where the tunneling dielectric layer is a multilayer structure like that described above. The memory cell also includes a n+-doped source terminal 304 which is coupled to a source line SL, a n+-doped inter-transistor terminal 305 and a n+-doped drain terminal 306 coupled to a bit line BL. A channel region 310 for the access transistor lies between the terminals at 304 and 305 in the p-type semiconductor body. A channel region 311 for the memory transistor lies between the terminals 305 and 306 in the p-type semiconductor body. The semiconductor body can be implemented as a p-type well, isolated from the bulk silicon by a triple well structure, or otherwise. Alternatively, the semiconductor body can be a silicon on insulator structure or other isolated structure that can be biased in the manner illustrated in these figures. FIGS. 14-22 include the same basic drawing labeled to illustrate various biasing arrangements. Thus the description of FIG. 14 just provided applies equally to the other figures as appropriate and such description is not repeated.

The biasing arrangement in FIG. 14 includes applying a voltage of for example 3.3 V to the access gate, the reference voltage Vref to the memory gate, grounding the source line and applying a drain voltage of about 1 V to the bit line. This results in an inversion layer turning on the channel 310 of the access transistor (symbolized in the figure by the hatching of a region near the channel surface). However, the high threshold state in the memory transistor prevents the channel 311 in the memory transistor from turning on (symbolized in the figure by the absence of the hatching in the region near the channel surface). Therefore, if the memory cell has been programmed to a high threshold state, then the off condition of the memory cell is sensed on the bit line under these bias conditions. The relatively low voltage 3.3 V applied across the access transistor is below the level required to allow charge tunneling into the charge trapping layer of the access transistor. Likewise, no disturbance of the charge trapping in the memory cell is caused during the read operation.

FIG. 15 illustrates a representative biasing arrangement for reading a memory cell, in which the memory transistor has a low threshold state, symbolized in a figure by the "h+" symbols in the charge trapping layer. The biasing arrangement in FIG. 15 includes applying a voltage of for example 3.3 V to the access gate, the reference voltage Vref to the memory gate, grounding the source line and applying a drain voltage of about 1 V to the bit line. This results in turning on the channel 310 of the access transistor. The low threshold state in the memory transistor also results in turning on the channel 311 in the memory transistor. Therefore, if the memory cell has a low threshold state (erased state), then the on condition of the memory cell is sensed on the bit line under these bias conditions. The relatively low voltage 3.3 V applied across the access transistor is below the level required to allow charge tunneling into the charge trapping layer of the access transistor. Likewise, no disturbance of the charge trapping in the memory cell is caused during the read operation.

FIGS. 16 and 17 illustrate representative biasing arrangement for a positive voltage, FN tunneling used for programming selected memory cells. The biasing arrangement as applied to the selected memory cell is shown in FIG. 16, while the biasing arrangement as encountered by an unselected memory cell along the same memory gate word line as the selected memory cell is shown in FIG. 17. The biasing arrangement for programming a selected cell includes floating or alternatively applying 0V to the source line, applying 0V or a below threshold voltage to the access gate word lines in the array, applying 0V or similar reference voltage to the bit line of the selected cell, and applying 0V or similar reference voltage to the semiconductor body. A programming voltage Vpp of about +15 V is applied to the memory gate word line. Vpp can range for example between about +12 V and about +20 V, depending on the effective oxide thickness of the dielectric stack in the memory cell. This results in an inversion layer turning on the channel 311 of the memory transistor, which adopts a voltage level as determined by the bias on the bit line and the semiconductor body of about 0 V. As result, electric field is established across the tunneling dielectric layer that induces electron tunneling into the charge trapping layer, increasing the threshold voltage of the selected memory cell.

FIG. 17 illustrates the programming bias arrangement as encountered by another, unselected memory cell on the same memory gate word line as the selected cell. As can be seen, the bit lines for unselected memory cells are biased with an inhibit voltage, such as about +5 V. Inhibit voltage can range between about +4 V and +8 V, for example. This results in the inversion region in the channel 311 adopting a voltage level of about equal to the inhibit voltage. The electric field across the tunneling dielectric layer in this unselected cell caused by the difference between the programming voltage Vpp and the inhibit voltage, remains below a level at which significant electron tunneling occurs. Therefore, program disturb of the other memory cells along the memory gate word line is avoided. Unselected memory gate word lines are biased with a voltage level of about 0 V. For memory cells that share the same bit line as the selected cell, without sharing the same memory gate word line, the electric field across the dielectric stack, likewise remains below the tunneling threshold.

FIG. 18 illustrates the erasing bias arrangement for a sector erase operation. During sector erase, the bit lines in a sector and the source lines in a sector are left floating. The semiconductor body is coupled to 0 V or a suitable reference voltage. The access gate word lines in the sector are also coupled to 0 V or other suitable reference voltage. The memory gate word lines in the sector are coupled to an erase potential Vers, such as about −15 V. The value of the erase potential Vers can vary between about −12 and −19 V in representative systems. This sector erase biasing arrangement results in an electric field across the tunneling dielectric layer that induces hole tunneling from the channel into the charge trapping structure, to induce a low threshold state for memory cells in the sector.

FIGS. 19 and 20 illustrate representative biasing arrangement for a positive voltage, FN tunneling used for programming selected memory cells using a divided well voltage technique, which substantially reduces the magnitudes of the voltage that must be produced by charge pumping on the device. This approach assists in the integration of the 2T NOR array as embedded memory. The biasing arrangement as applied to the selected memory cell shown in FIG. 19, while the biasing arrangement as encountered by an unselected memory cell along the same memory gate word line as the selected memory cell is shown in FIG. 20. The biasing arrangement for programming a selected cell includes floating or alternatively applying 0 V to the source line, applying about −5V, or a voltage to keep the voltage across the gate and channel below threshold voltage, to the access gate word lines in the array, applying negative well potential Vwell, of for example −5 V, to the semiconductor body and to the bit line of the selected cell. A programming voltage Vpp of about +15 V across the cell is produced by applying Vpp−|Vwell| to the memory gate word line. This results in an inversion layer turning on the channel 311 of the memory transistor, which adopts a voltage level as determined by the bias on the bit line and the semiconductor body of about −5 V in this example. As a result, an electric field is established across the tunneling dielectric layer that induces electron tunneling into the charge trapping layer, increasing the threshold voltage of the selected memory cell.

FIG. 20 illustrates the divided well, programming bias arrangement as encountered by another, unselected memory cell on the same memory gate word line as the selected cell. As can be seen, the bit lines for unselected memory cells are biased with an inhibit voltage, such as about 0 V. This results in the inversion region in the channel 311 adopting a voltage level of about equal to the inhibit voltage. The electric field across the tunneling dielectric layer in this unselected cell caused by the difference between the voltage on the memory gate word line and the inhibit voltage, remains below a level at which significant electron tunneling occurs. Therefore, program disturb of the other memory cells along the memory gate word line is avoided. Unselected memory gate word lines are biased with a voltage level of about −5 V as well. For memory cells that share the same bit line as the selected cell, without sharing the same memory gate word line, the electric field across the dielectric stack, likewise remains below the tunneling threshold.

FIGS. 21 and 22 illustrate representative biasing arrangement for channel hot electron injection used for programming selected memory cells. The biasing arrangement as applied to the selected memory cell shown in FIG. 21, while the biasing arrangement as encountered by an unselected memory cell along the same memory gate word line as the selected memory cell is shown in FIG. 22. The biasing arrangement for programming a selected cell includes applying 0 V or a suitable reference voltage to the source line and semiconductor body, and applying about +5 V to the access gate word lines in the array. A programming voltage Vpp of about +10 V is applied to the memory gate word line. This results in an inversion layer turning on the channel 310 of the access gate transistor and an inversion layer turning on the channel 311 of the memory transistor. The drain of the selected cell is biased to about +5 V. As result, an electric field is established across the tunneling dielectric layer that induces hot electrons in the channel to inject into the charge trapping layer, increasing the threshold voltage of the selected memory cell.

In an alternative embodiment, the voltage applied to the access gate word lines can be set close to the threshold of the cell, so that the channel 310 of the access transistor does not achieve full saturation, and acts as a current limiter during CHE programming. This biasing technique can modulate the programming speed as well as save power.

FIG. 22 illustrates the programming bias arrangement as encountered by another, unselected memory cell on the same memory gate word line as the selected cell. As can be seen, the bit lines for unselected memory cells are biased with an inhibit voltage, such as about 0 V. This prevents current in the inversion region in the channel 311, and inhibits hot electron injection. Therefore, program disturb of the other memory cells along the memory gate word line is avoided. Unselected memory gate word lines and unselected access gate word lines are biased with a voltage level of about 0 V. For memory cells that share the same bit line as the selected cell, without sharing the same memory gate word line, the electric field across the dielectric stack, likewise remains below the tunneling threshold.

Figure 23:
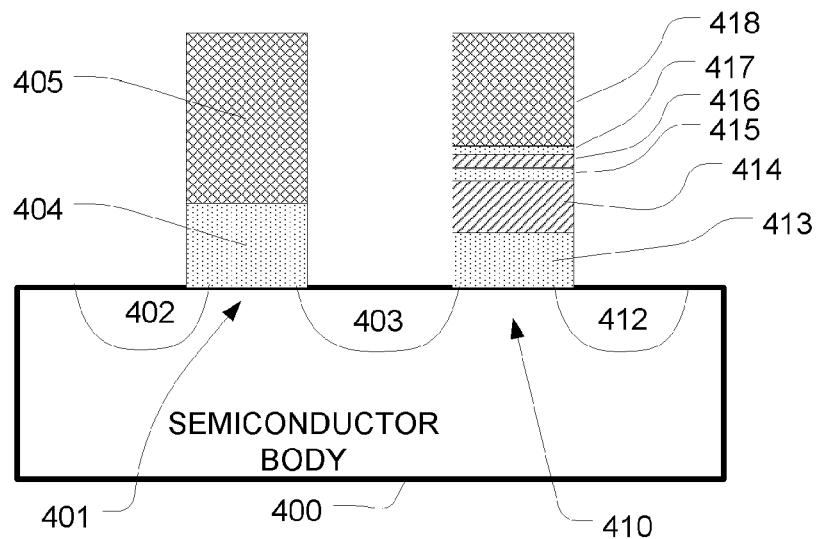
FIG. 23 is a cross-section 2T memory cell based on a gate injection, BE-SONOS memory transistor.

FIG. 23 is a simplified diagram of a 2T cell including charge trapping memory transistor employing a bandgap engineered dielectric tunneling layer, in a gate injection structure. Gate injection mode may result in greater endurance for the memory cell, as stress on the gate dielectric (blocking dielectric layer in these embodiments) is reduced, and as a result, generation of interface states that interfere with long operation of device, is reduced. The memory cell is formed on a semiconductor body 400, and includes an access transistor and memory transistor. The access transistor includes a channel 401, a source 402 and a drain in terminal 403. A gate dielectric layer 404 overlies the channel 401, and a gate 405 overlies the gate dielectric 404. The memory transistor includes a channel 410, a source in terminal 403 and a drain 412 adjacent the channel. A gate 418 overlies a multilayer stack of dielectric materials acting as the charge storage structure, including the blocking dielectric layer 413, the charge trapping layer 414 and the bandgap engineered dielectric tunneling layer. In this example, the charge trapping layer is in contact with the tunneling layer, but can be otherwise disposed between the tunneling layer and the channel surface. Likewise, the blocking layer in this example is in contact with the charge trapping layer, but can be otherwise disposed between the charge trapping layer and the channel surface.

In the embodiment illustrated in FIG. 23, the dielectric tunneling layer comprises a composite of materials, including a first layer 417, referred to as a hole tunneling layer, of silicon dioxide adjacent the gate 418. Next, a layer 416, referred to as a band offset layer, of silicon nitride lies on the first layer 417 of silicon oxide. The thickness of the layer 416 of silicon nitride is less than 30 Å, and preferably 25 Å or less.

A second layer 415 of silicon dioxide, referred to as an isolation layer, lies between the layer 416 of silicon nitride and the change trapping layer 414. The thickness of the second layer 415 of silicon dioxide is less than 35 Å, and preferably 25 Å or less. This structure enables electric field assisted, gate injection hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

Figure 24:
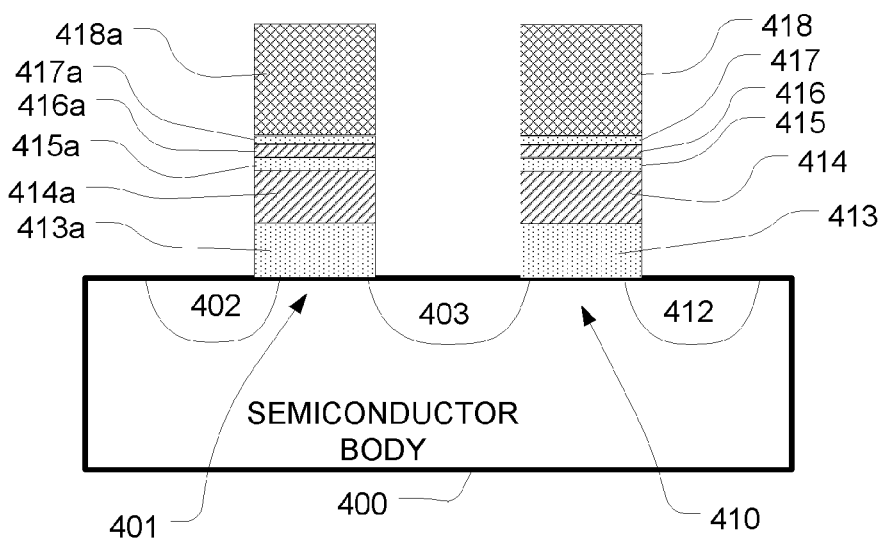
FIG. 24 is a cross-section of a 2T memory cell using a gate injection, BE-SONOS transistor for both the access transistor and the memory transistor.

FIG. 24 illustrates an alternative structure for the unit 2T memory cell in a gate injection structure, in which the gate dielectric of the access transistor is made using the same dielectric stack as that of the memory transistor. As shown in FIG. 24, the access transistor as a gate 418a, a blocking dielectric layer 413a, a charge trapping layer 414a and a tunneling dielectric layer including layers 417a, 416a and 415a. Otherwise, the structure is similar to that of FIG. 23.

Figure 25:
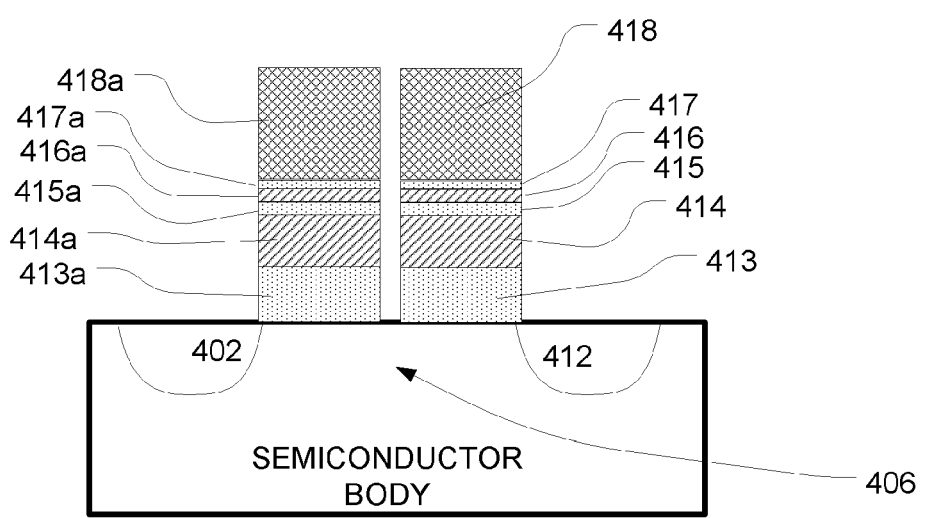
FIG. 25 is a cross-section of a "junction-free" 2T memory cell using a gate injection, BE-SONOS transistor for both the access transistor and the memory transistor, without a doped terminal to provide a junction between the access transistor and the memory transistor.

FIG. 25 illustrates an even higher density alternative structure for the gate injection unit 2T memory cell, using a "junction-free" structure. The 2T cell of FIG. 25 is implemented with the gate dielectric of the access transistor and made using the same dielectric stack as that of the memory transistor, like FIG. 24. The same reference numerals are applied to the layers to emphasize the similar structure. However, there is no doped region 403 found in the structure of FIG. 25. Rather, a continuous channel region 406 extends between the source terminal 402 and the drain terminal 412.

Figure 26:
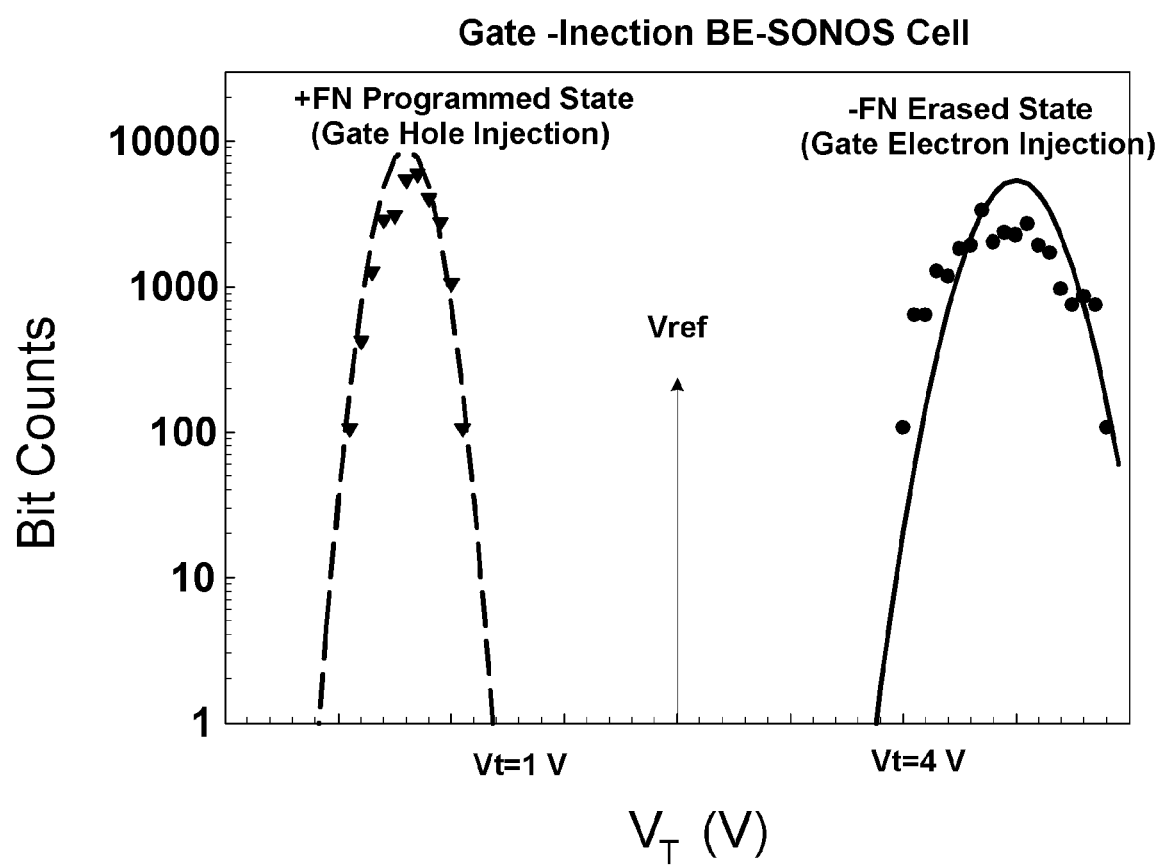
FIG. 26 is a diagram showing a distribution of threshold voltages for gate injection, BE-SONOS memory transistors in the erased and programmed states.

FIG. 26 is a graph of the number of memory cells ("bit counts") versus threshold voltage for a typical n-channel BE-SONOS memory transistor having the tunnel dielectric structure adjacent the gate, for a programmed state corresponding to a low threshold value induced by Fowler Nordheim hole tunneling with a positive voltage on the gate, and for an erased state corresponding to a high threshold value induced by Fowler Nordheim electron tunneling with the negative voltage on the gate. The voltage Vref labeled in the figure can be used as a word line voltage could establish between programmed and erased state transistors. In this example, a suitable Vref is about +2.5 V, the high threshold state corresponds with threshold voltages greater than about +4 V and the low threshold state corresponds with threshold voltages lower than about +1 V.

FIGS. 27-34 illustrate biasing arrangements for gate injection, memory cells like that shown in FIG. 24, wherein the memory transistors have programmed state and erased state characteristics similar to those shown in FIG. 26. FIG. 27 illustrates a representative biasing arrangement for reading a memory cell, in which the memory transistor has a programmed low threshold state, symbolized in a figure by the "h+" symbols in the charge trapping layer 502. The memory cell shown in FIG. 27 includes an access transistor having access gate AG and a memory transistor having a memory gate MG. The dielectric stack in both the access transistor and the memory transistor includes a blocking dielectric layer 503, a charge trapping layer 502, and a tunneling dielectric layer 501 adjacent the memory gate, where the tunneling dielectric layer is the multilayer structure described above. The memory cell also includes a n+-doped source terminal 504 which is coupled to a source line SL, a n+-doped inter-transistor terminal 505 and a n+-doped drain terminal 506 coupled to a bit line BL. A channel region 510 for the access transistor lies between the terminals at 504 and 505 in the p-type semiconductor body. A channel region 511 for the memory transistor lies between the terminals 505 and 506 in the p-type semiconductor body. The semiconductor body can be implemented as a p-type well, isolated from the bulk silicon by a triple well structure, or otherwise. Alternatively, the semiconductor body can be a silicon on insulator structure or other isolated structure that can be biased in the manner illustrated in these figures. FIGS. 27-34 include the same basic drawing labeled to illustrate various biasing arrangements. Thus the description of FIG. 27 just provided applies equally to the other figures as appropriate and such description is not repeated.

The biasing arrangement in FIG. 27 includes applying a voltage of for example 3 V to the access gate, the reference voltage Vref to the memory gate, grounding the source line and applying a drain voltage of about 1 V to the bit line. This results in an inversion layer turning on the channel 510 of the access transistor (symbolized in the figure by the hatching of a region near the channel surface). Also, the low threshold state in the memory transistor causes the channel 511 in the memory transistor to turn on. Therefore, if the memory cell has been programmed to a low threshold state, then the on condition of the memory cell is sensed on the bit line under these bias conditions. The relatively low voltage 3 V applied across the access transistor is below the level required to allow charge tunneling into the charge trapping layer of the access transistor. Likewise, no disturbance of the charge trapping in the memory cell is caused during the read operation.

FIG. 28 illustrates a representative biasing arrangement for reading a memory cell, in which the memory transistor has a high threshold state, symbolized in a figure by the "e+" symbols in the charge trapping layer. The biasing arrangement in FIG. 28 includes applying a voltage of for example 3 V to the access gate, the reference voltage Vref to the memory gate, grounding the source line and applying a drain voltage of about 1 V to the bit line. This results in turning on the channel 510 of the access transistor. The high threshold state in the memory transistor prevents the channel 511 from turning on in the memory transistor. Therefore, if the memory cell has a high threshold state (erased state), then the off condition of the memory cell is sensed on the bit line under these bias conditions. The relatively low voltage 3 V applied across the access transistor is below the level required to allow charge tunneling into the charge trapping layer of the access transistor. Likewise, no disturbance of the charge trapping in the memory cell is caused during the read operation.

FIGS. 29 and 30 illustrate representative biasing arrangement for a positive voltage, FN hole tunneling used for programming selected memory cells. The biasing arrangement as applied to the selected memory cell shown in FIG. 29, while the biasing arrangement as encountered by an unselected memory cell along the same memory gate word line as the selected memory cell is shown in FIG. 30. The biasing arrangement for programming a selected cell includes floating or alternatively applying 0 V to the source line, applying 0 V or a below threshold voltage to the access gate word lines in the array, applying 0 V or similar reference voltage to the bit line of the selected cell, and applying 0 V or similar reference voltage to the semiconductor body. A programming voltage Vpp of about +15 V is applied to the memory gate word line. Vpp can range for example between about +12 V and about +20 V, depending on the effective oxide thickness of the dielectric stack in the memory cell. This results in an inversion layer turning on the channel 511 of the memory transistor, which adopts a voltage level as determined by the bias on the bit line and the semiconductor body of about 0 V. As result, electric field is established across the tunneling dielectric layer that induces gate injection, hole tunneling into the charge trapping layer, lowering the threshold voltage of the selected memory cell.

FIG. 30 illustrates the programming bias arrangement as encountered by another, unselected memory cell on the same memory gate word line as the selected cell. As can be seen, the bit lines for unselected memory cells are biased with an inhibit voltage, such as about +5 V. Inhibit voltage can range between about +4 V and +8 V, for example. This results in the inversion region in the channel 511 adopting a voltage level of about equal to the inhibit voltage. The electric field across the tunneling dielectric layer in this unselected cell caused by the difference between the programming voltage Vpp and the inhibit voltage, remains below a level at which significant hole tunneling occurs. Therefore, program disturb of the other memory cells along the memory gate word line is avoided. Unselected memory gate word lines are biased with a voltage level of about 0 V. For memory cells that share the same bit line as the selected cell, without sharing the same memory gate word line, the electric field across the dielectric stack, likewise remains below the tunneling threshold.

FIG. 31 illustrates the erasing bias arrangement for a sector erase operation. During sector erase, the bit lines in a sector and the source lines in a sector are left floating. The semiconductor body is coupled to 0 V or a suitable reference voltage. The access gate word lines in the sector are also coupled to 0 V or other suitable reference voltage. The memory gate word lines in the sector are coupled to an erase potential Vers, such as about −15 V. The value of the erase potential Vers can vary between about −12 and −19 V in representative systems. This sector erase biasing arrangement results in an electric field across the tunneling dielectric layer that induces electron tunneling from the gate into the charge trapping structure, to induce a high threshold state for memory cells in the sector.

FIGS. 32 and 33 illustrate representative biasing arrangement for channel hot electron injection used for programming selected memory cells to high threshold states. The biasing arrangement as applied to the selected memory cell shown in FIG. 32, while the biasing arrangement as encountered by an unselected memory cell along the same memory gate word line as the selected memory cell is shown in FIG. 33. The biasing arrangement for programming a selected cell includes applying 0 V or a suitable reference voltage to the source line and semiconductor body, and applying about +5 V to the access gate word lines in the array. A programming voltage Vpp of about +10 V is applied to the memory gate word line. This results in an inversion layer turning on the channel 510 of the access gate transistor and an inversion layer turning on the channel 511 of the memory transistor. The drain of the selected cell is biased to about +5 V. As result, an electric field is established across the blocking dielectric layer that induces hot electrons in the channel to inject into the charge trapping layer, increasing the threshold voltage of the selected memory cell. In devices utilizing this programming bias operation, a gate injection FN hole tunneling bias is used for erase, allowing sector erase processes.

In an alternative embodiment, the voltage applied to the access gate word lines can be set close to the threshold of the cell, so that the channel 510 of the access transistor does not achieve full saturation, and acts as a current limiter during CHE programming. This biasing technique can modulate the programming speed as well as save power.

FIG. 33 illustrates the programming bias arrangement as encountered by another, unselected memory cell on the same memory gate word line as the selected cell. As can be seen, the bit lines for unselected memory cells are biased with an inhibit voltage, such as about 0 V. This prevents current in the inversion region in the channel 511 of the memory transistor, and inhibits hot electron injection. Therefore, program disturb of the other memory cells along the memory gate word line is avoided. Unselected memory gate word lines and unselected access gate word lines are biased with a voltage level of about 0 V. For memory cells that share the same bit line as the selected cell, without sharing the same memory gate word line, the electric field across the dielectric stack, likewise remains below the tunneling threshold.

FIG. 34 illustrates a biasing arrangement for programming a selected cell by CHE programming, in a "junction-free" gate injection embodiment, having a continuous channel region 515 between the terminals coupled to the bit line and the source line. The biasing arrangement includes applying 0 V or a suitable reference voltage to the source line and semiconductor body, and applying about +5 V to the access gate word lines in the array. A programming voltage Vpp of about +10 V is applied to the memory gate word line. This results in an inversion layer turning on the channel 515 beneath the access gate transistor and an inversion layer turning on the channel 515 beneath the memory transistor. The drain of the selected cell is biased to about +5 V. As result, an electric field is established across the blocking dielectric layer that induces hot electrons in the channel to inject into the charge trapping layer, increasing the threshold voltage of the selected memory cell. In this embodiment, the focus of highest lateral field may be closer to the center of the memory gate than in the device of FIG. 33, as illustrated by the location of the arrow, similar to a source side injection process. This can result in higher injection efficiency.

FIGS. 35-39 illustrate biasing arrangements for p-channel, channel injection embodiments of the 2T NOR architecture cells described herein. FIG. 35 illustrates a representative biasing arrangement for reading a memory cell, in which the memory transistor has a high threshold state, symbolized in a figure by the "e−" symbols in the charge trapping layer 602. The memory cell shown in FIG. 35 includes an access transistor having access gate AG and a memory transistor having a memory gate MG. The dielectric stack in both the access transistor and the memory transistor includes a blocking dielectric layer 601, a charge trapping layer 602, and a tunneling dielectric layer 603, where the tunneling dielectric layer is the multilayer structure described above. The memory cell also includes a p+-doped source terminal 604 which is coupled to a source line SL, a p+-doped inter-transistor terminal 605 and a p+-doped drain terminal 606 coupled to a bit line BL. A channel region 610 for the access transistor lies between the terminals at 604 and 605 in the n-type semiconductor body. A channel region 611 for the memory transistor lies between the terminals 605 and 606 in the n-type semiconductor body. The semiconductor body can be implemented as a n-type well, isolated from the bulk silicon by a triple well structure, or otherwise. Alternatively, the semiconductor body can be a silicon on insulator structure or other isolated structure that can be biased in the manner illustrated in these figures. FIGS. 35-39 include the same basic drawing labeled to illustrate various biasing arrangements. Thus the description of FIG. 39 just provided applies equally to the other figures as appropriate and such description is not repeated.

The biasing arrangement in FIG. 35 includes applying a voltage of for example −6 V to the access gate, the reference voltage Vref to the memory gate, grounding the source line and applying a drain voltage of about −1 V to the bit line. Vref for a p-channel cell can be for example, about −3V. This results in an inversion layer turning on the channel 610 of the access transistor (symbolized in the figure by the hatching of a region near the channel surface). However, the high threshold state (e.g. greater than about −2V) in the memory transistor causes the channel 611 in the memory transistor to turn on. Therefore, if the memory cell has been programmed to a high threshold state, then the on condition of the memory cell is sensed on the bit line under these bias conditions. The relatively low voltage −6 V applied across the access transistor is below the level required to allow charge tunneling into the charge trapping layer of the access transistor. Likewise, no disturbance of the charge trapping in the memory cell is caused during the read operation.

FIG. 36 illustrates a representative biasing arrangement for reading a memory cell, in which the memory transistor has a low threshold state (e.g. less than −4.5 V), symbolized in a figure by the "h+" symbols in the charge trapping layer. The biasing arrangement in FIG. 36 includes applying a voltage of for example −6 V to the access gate, the reference voltage Vref to the memory gate, grounding the source line and applying a drain voltage of about −1 V to the bit line. This results in turning on the channel 610 of the access transistor. The low threshold state in the memory transistor prevents the channel 611 from turning on in the memory transistor. Therefore, if the memory cell has a low threshold state (erased state), then the off condition of the memory cell is sensed on the bit line under these bias conditions. The relatively low voltage −6 V applied across the access transistor is below the level required to allow charge tunneling into the charge trapping layer of the access transistor. Likewise, no disturbance of the charge trapping in the memory cell is caused during the read operation.

FIGS. 37 and 38 illustrate representative biasing arrangement for a negative voltage, FN hole tunneling used for programming selected memory cells. The biasing arrangement as applied to the selected memory cell shown in FIG. 37, while the biasing arrangement as encountered by an unselected memory cell along the same memory gate word line as the selected memory cell is shown in FIG. 38. The biasing arrangement for programming a selected cell includes floating or alternatively applying 0 V to the source line, applying 0 V or an above threshold voltage to the access gate word lines in the array, applying 0 V or similar reference voltage to the bit line of the selected cell, and applying 0 V or similar reference voltage to the semiconductor body. A programming voltage Vpp of about −15 V is applied to the memory gate word line. Vpp can range for example between about −12 V and about −20 V, depending on the effective oxide thickness of the dielectric stack in the memory cell. This results in an inversion layer turning on the channel 611 of the memory transistor, which adopts a voltage level as determined by the bias on the bit line and the semiconductor body of about 0 V. As result, electric field is established across the tunneling dielectric layer that induces channel injection, hole tunneling into the charge trapping layer, lowering the threshold voltage of the selected memory cell.

FIG. 38 illustrates the programming bias arrangement as encountered by another, unselected memory cell on the same memory gate word line as the selected cell. As can be seen, the bit lines for unselected memory cells are biased with an inhibit voltage, such as about −5 V. Inhibit voltage can range between about −4 V and −8 V, for example. This results in the inversion region in the channel 611 adopting a voltage level of about equal to the inhibit voltage. The electric field across the tunneling dielectric layer in this unselected cell caused by the difference between the programming voltage Vpp and the inhibit voltage, remains below a level at which significant tunneling occurs. Therefore, program disturb of the other memory cells along the memory gate word line is avoided. Unselected memory gate word lines are biased with a voltage level of about 0 V. For memory cells that share the same bit line as the selected cell, without sharing the same memory gate word line, the electric field across the dielectric stack, likewise remains below the tunneling threshold.

FIG. 39 illustrates the erasing bias arrangement for a sector erase operation. During sector erase, the bit lines in a sector and the source lines in a sector are left floating. The semiconductor body is coupled to 0 V or a suitable reference voltage. The access gate word lines in the sector are also coupled to 0 V or other suitable reference voltage. The memory gate word lines in the sector are coupled to an erase potential Vers, such as about +15 V. The value of the erase potential Vers can vary between about +12 and +19 V in representative systems. This sector erase biasing arrangement results in an electric field across the tunneling dielectric layer that induces electron tunneling from the channel into the charge trapping structure, to induce a high threshold state for memory cells in the sector.

FIGS. 40-44 illustrate biasing arrangements biasing arrangements for p-channel, gate injection embodiments of the 2T NOR architecture cells described herein. FIG. 40 illustrates a representative biasing arrangement for reading a memory cell, in which the memory transistor has a programmed low threshold state, symbolized in a figure by the "h+" symbols in the charge trapping layer 702. The memory cell shown in FIG. 40 includes an access transistor having access gate AG and a memory transistor having a memory gate MG. The dielectric stack in both the access transistor and the memory transistor includes a blocking dielectric layer 703, a charge trapping layer 702, and a tunneling dielectric layer 701, where the tunneling dielectric layer is the multilayer structure described above, adjacent the memory gate. The memory cell also includes a p+-doped source terminal 704 which is coupled to a source line SL, a p+-doped intertransistor terminal 705 and a p+-doped drain terminal 706 coupled to a bit line BL. A channel region 710 for the access transistor lies between the terminals at 504 and 505 in the p-type semiconductor body. A channel region 711 for the memory transistor lies between the terminals 705 and 706 in the n-type semiconductor body. The semiconductor body can be implemented as a n-type well, isolated from the bulk silicon by a triple well structure, or otherwise. Alternatively, the semiconductor body can be a silicon on insulator structure or other isolated structure that can be biased in the manner illustrated in these figures. FIGS. 40-44 include the same basic drawing labeled to illustrate various biasing arrangements. Thus the description of FIG. 40 just provided applies equally to the other figures as appropriate and such description is not repeated.

The biasing arrangement in FIG. 40 includes applying a voltage of for example −3 V to the access gate, the reference voltage Vref to the memory gate, grounding the source line and applying a drain voltage of about −1 V to the bit line. This results in an inversion layer turning on the channel 710 of the access transistor (symbolized in the figure by the hatching of a region near the channel surface). Also, the low threshold state in the memory transistor causes the channel 711 in the memory transistor to turn off. Therefore, if the memory cell has been erased to a low threshold state, then the off condition of the memory cell is sensed on the bit line under these bias conditions. The relatively low voltage −3 V applied across the access transistor is below the level required to allow charge tunneling into the charge trapping layer of the access transistor. Likewise, no disturbance of the charge trapping in the memory cell is caused during the read operation.

FIG. 41 illustrates a representative biasing arrangement for reading a memory cell, in which the memory transistor has a high threshold state, symbolized in a figure by the "e−" symbols in the charge trapping layer. The biasing arrangement in FIG. 41 includes applying a voltage of for example −3 V to the access gate, the reference voltage Vref to the memory gate, grounding the source line and applying a drain voltage of about −1 V to the bit line. This results in turning on the channel 710 of the access transistor. The high threshold state in the memory transistor causes the channel 711 to turn on in the memory transistor. Therefore, if the memory cell has a high threshold state (programmed state), then the on condition of the memory cell is sensed on the bit line under these bias conditions. The relatively low voltage −3 V applied across the access transistor is below the level required to allow charge tunneling into the charge trapping layer of the access transistor. Likewise, no disturbance of the charge trapping in the memory cell is caused during the read operation.

FIGS. 42 and 43 illustrate representative biasing arrangement for a negative voltage, FN electron tunneling used for programming selected memory cells. The biasing arrangement as applied to the selected memory cell shown in FIG. 42, while the biasing arrangement as encountered by an unselected memory cell along the same memory gate word line as the selected memory cell is shown in FIG. 43. The biasing arrangement for programming a selected cell includes floating or alternatively applying 0 V to the source line, applying 0 V or a below threshold voltage to the access gate word lines in the array, applying 0 V or similar reference voltage to the bit line of the selected cell, and applying 0 V or similar reference voltage to the semiconductor body. A programming voltage Vpp of about −17 V is applied to the memory gate word line, in this example. This results in an inversion layer turning on the channel 711 of the memory transistor, which adopts a voltage level as determined by the bias on the bit line and the semiconductor body of about 0 V. As result, electric field is established across the tunneling dielectric layer that induces gate injection, electron tunneling into the charge trapping layer, raising the threshold voltage of the selected memory cell.

FIG. 43 illustrates the programming bias arrangement as encountered by another, unselected memory cell on the same memory gate word line as the selected cell. As can be seen, the bit lines for unselected memory cells are biased with an inhibit voltage, such as about −7 V, in this example. This results in the inversion region in the channel 711 adopting a voltage level of about equal to the inhibit voltage. The electric field across the tunneling dielectric layer in this unselected cell caused by the difference between the programming voltage Vpp and the inhibit voltage, remains below a level at which significant electron tunneling occurs. Therefore, program disturb of the other memory cells along the memory gate word line is avoided. Unselected memory gate word lines are biased with a voltage level of about 0 V. For memory cells that share the same bit line as the selected cell, without sharing the same memory gate word line, the electric field across the dielectric stack, likewise remains below the tunneling threshold.

FIG. 44 illustrates the erasing bias arrangement for a sector erase operation. During sector erase, the bit lines in a sector and the source lines in a sector are left floating. The semiconductor body is coupled to 0 V or a suitable reference voltage. The access gate word lines in the sector are also coupled to 0 V or other suitable reference voltage. The memory gate word lines in the sector are coupled to an erase potential Vers, such as about +17 V, in this example. This sector erase biasing arrangement results in an electric field across the tunneling dielectric layer that induces hole tunneling from the gate into the charge trapping structure, to induce a low threshold state for memory cells in the sector.

Figure 45:
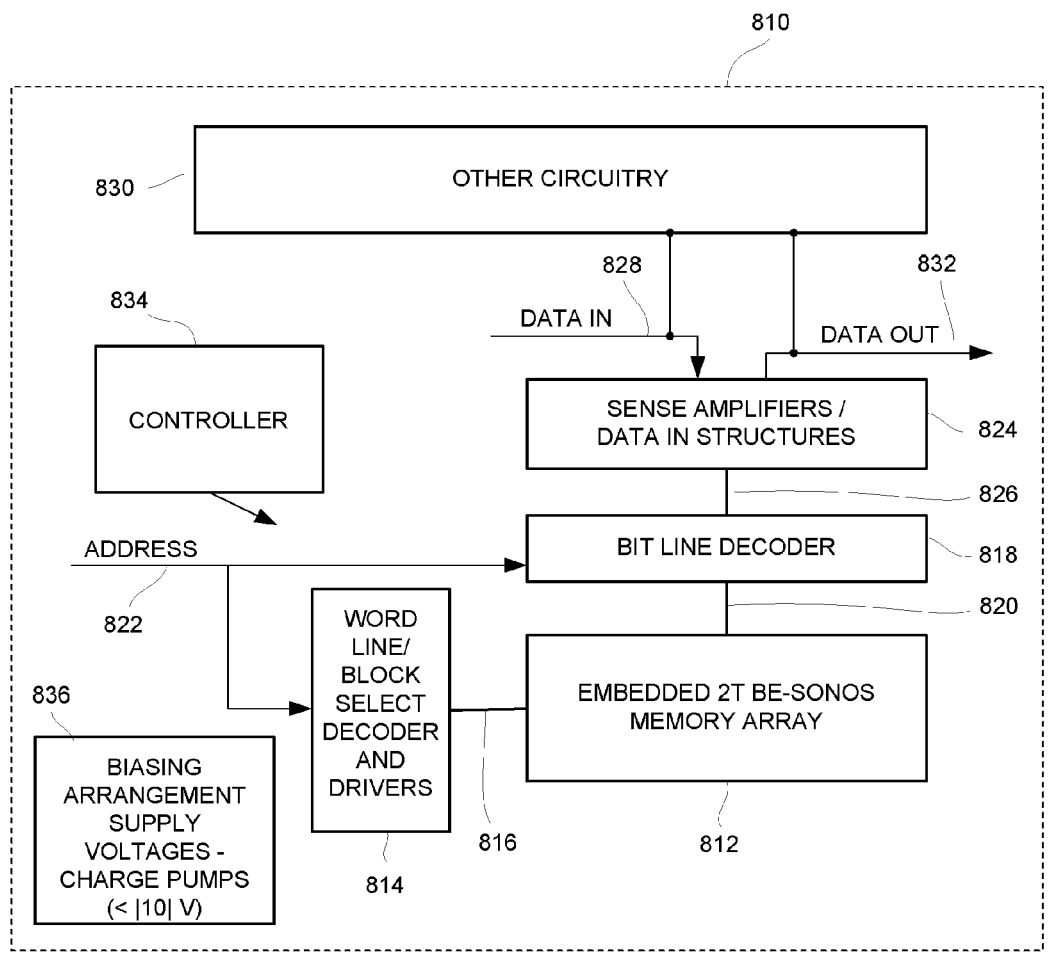
FIG. 45 is a block diagram of an integrated circuit including an embedded 2T BE-SONOS memory as described herein.

FIG. 45 is a simplified block diagram of an integrated circuit employing BE-SONOS memory cells in a 2T NOR architecture, as described herein having memory transistors, or both memory transistors and access transistors, with a bandgap engineered tunneling dielectric layer. The integrated circuit 810 includes a memory array 812 on a semiconductor substrate. A word line (or row) and block select decoder 814 is coupled to, and in electrical communication with, a plurality 816 of access gate word lines, memory gate word lines, and optionally block select lines, arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Addresses are supplied on bus 822 to the word line decoder and drivers 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824.

In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

The array 812 is implemented in a 2T NOR architecture. The very large memory window available supports storing multiple bits per cell. In embodiments supporting multiple bits per memory cell in the array, the controller includes logic for programming and reading multiple bits per cell. Also, multiple bit sense amplifiers are included on devices supporting multiple bits per cell.

A controller implemented in this example, using bias arrangement state machine 834, controls the application of bias arrangement supply voltages and current sources 836, such as read, program, erase, erase verify, program verify voltages or currents for the word lines and bit lines, and controls the word line/source line operation using an access control process. The integrated circuit includes charge pumps or other circuits for producing negative voltages and positive voltages higher than the supply potential VDD, used for driving the biasing arrangements discussed above. Embodiments of the technology described here can be made in which the highest magnitude of voltage (positive or negative) is less than 10 volts, making the size and complexity of charge pumps smaller, and reducing risk to high voltage breakdown of devices on the chip.

The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
a memory array comprising plural bit lines coupled with corresponding columns of memory cells in the array, plural reference lines, a plurality of access gate word lines coupled to access gates in corresponding rows in the array and a plurality of memory gate word lines coupled to memory gates in corresponding rows in the array, wherein the memory cells include respective access transistors having access gates and memory transistors having memory gates arranged in series between the corresponding bit lines and one of the plural reference lines, the respective access transistors coupled either (i) in series between the memory transistors and the corresponding bit lines or (ii) in series between the memory transistors and one of the plural reference lines, and not (iii) in series between the memory transistors and the corresponding bit lines and between the memory transistors and one of the plural reference lines, wherein the respective access transistor does not store charge, and the respective access transistor is adjacent to a doped region of at least one of the corresponding bit lines and one of the plural reference lines;

control circuitry including logic for reading, programming and erasing data stored in the memory cells in the array;

wherein at least one of the memory transistors comprises a semiconductor body including a channel having a channel surface and a dielectric stack between the memory gate and the channel surface; the dielectric stack comprising a tunneling dielectric layer contacting one of the gate and the channel surface including a combination of materials arranged to establish a relatively low valence band energy level near said one of the gate and the channel surface, and an increase in valence band energy level at a first distance from said one of the gate and the channel surface and a decrease in valence band energy at a second distance more than 2 nm from said one of the gate and the channel surface;

a charge trapping dielectric layer between the tunneling dielectric layer and another of the gate and the channel surface having a thickness greater than 5 nm;

a multilayer blocking dielectric between the charge trapping dielectric layer and said another of the gate and the channel surface including an oxide layer with a first dielectric constant and a dielectric layer with a second dielectric constant exceeding the first dielectric constant.

2. The integrated circuit of claim 1, wherein the tunneling dielectric layer is adjacent the channel surface, and the control circuitry is arranged to program memory cells in the array to a high threshold state by FN electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

3. The integrated circuit of claim 1, wherein the tunneling dielectric layer is adjacent the channel surface, and the control circuitry is arranged to program memory cells in the array to a high threshold state by channel hot electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

4. The integrated circuit of claim 1, wherein the control circuitry is arranged to program memory cells in the array to a high threshold state by channel hot electron injection tunneling from the channel across the tunneling dielectric layer to the charge trapping layer, and to apply a voltage to the access gate biasing the access transistor is a current limiting mode.

5. The integrated circuit of claim 1, wherein for each memory cell, the semiconductor body includes first and second doped terminals separated by a channel region without an intervening junction, and the memory gate and access gate of a particular memory cell are arranged adjacent to one another and overly the channel region.

6. The integrated circuit of claim 1, wherein the access transistor includes a tunneling dielectric layer contacting one of the gate and the channel surface including a combination of materials arranged to establish a relatively low valence band energy level near said one of the gate and the channel surface, and an increase in valence band energy level at a first distance from said one of the gate and the channel surface and a decrease in valence band energy at a second distance more than 2 nm from said one of the gate and the channel surface;
a charge trapping dielectric layer on the tunneling dielectric layer having a thickness greater than 5 nm;
a blocking dielectric layer between the charge trapping layer and another of the gate and the channel surface; and
the control circuitry applies bias voltages to enable access to the memory transistors for reading, programming and erasing without causing significant charge trapping in the access transistor.

7. The integrated circuit of claim 1, wherein the memory transistor in the memory cells has a terminal in the semiconductor body, and including a conductive contact between the terminal and a bit line.

8. The integrated circuit of claim 1, wherein the tunneling dielectric layer is adjacent the memory gate.

9. The integrated circuit of claim 1, wherein the tunneling dielectric layer is adjacent the memory gate and the control circuitry is arranged to program the memory cells to a low threshold state by FN hole injection tunneling from the gate across the tunneling dielectric layer to the charge trapping layer and arranged to erase the memory cells to a high threshold state by FN electron tunneling from the gate across the tunneling dielectric layer to the charge trapping layer.

10. The integrated circuit of claim 1, wherein the tunneling dielectric layer is adjacent the memory gate and the control circuitry is arranged to erase the memory cells to a low threshold state by FN hole injection tunneling from the gate across the tunneling dielectric layer to the charge trapping layer and arranged to program the memory cells to a high threshold state by channel hot electron injection from the channel across the multilayer blocking dielectric to the charge trapping layer.

11. The integrated circuit integrated circuit of claim 1, the control circuitry is arranged to apply a positive programming potential across the memory cells in the array, by applying a negative voltage to the semiconductor body and a positive voltage to the memory gate, wherein the positive and negative voltages have absolute values less than 10 volts.

12. The integrated circuit of claim 1, the control circuitry is arranged to apply a negative programming potential across the memory cells in the array, by applying a positive voltage to the semiconductor body and a negative voltage to the memory gate, wherein the positive and negative voltages have absolute values less than 10 volts.

13. The integrated circuit of claim 1, the control circuitry includes logic for reading and programming multiple bits per memory cell in the array.

14. The integrated circuit of claim 1, wherein the control circuitry applies different bias arrangements to the memory transistors and the access transistors having a common structure.

15. An integrated circuit device, comprising:
a memory array comprising plural bit lines coupled with corresponding columns of memory cells in the array, plural reference lines, a plurality of access gate word lines coupled to access gates in corresponding rows in the array and a plurality of memory gate word lines coupled to memory gates in corresponding rows in the array, wherein the memory cells include respective access transistors having access gates and memory transistors having memory gates arranged in series between the corresponding bit lines and one of the plural reference lines, the respective access transistors coupled either (i) in series between the memory transistors and the corresponding bit lines or (ii) in series between the memory transistors and one of the plural reference lines, and not (iii) in series between the memory transistors and the corresponding bit lines and between the memory transistors and one of the plural reference lines, wherein the respective access transistor does not store charge, and the respective access transistor is adjacent to a doped region of at least one of the corresponding bit lines and one of the plural reference lines;

control circuitry including logic for reading, programming and erasing data stored in the memory cells in the array;

wherein the memory transistors and the access transistors have a common structure, the common structure comprising a semiconductor body including a channel having a channel surface and a dielectric stack between the gate and the channel surface; the semiconductor body including first and second doped terminals separated by a channel region without an intervening junction, and the memory gate and access gate of a particular memory cell are arranged adjacent to one another and overly the channel region, and wherein the dielectric stack comprises a tunneling dielectric layer contacting one of the gate and the channel surface including a combination of materials arranged to establish a relatively low valence band energy level near said one of the gate and the channel surface, and an increase in valence band energy level at a first distance from said one of the gate and the channel surface and a decrease in valence band energy at a second distance more than 2 nm from said one of the gate and the channel surface;

a charge trapping dielectric layer between the tunneling dielectric layer and another of the gate and the channel surface having a thickness greater than 5 nm;

a multilayer blocking dielectric between the charge trapping dielectric layer and said another of the gate and the channel surface including an oxide layer with a first dielectric constant and a dielectric layer with a second dielectric constant exceeding the first dielectric constant.

16. The integrated circuit of claim 15, wherein the tunneling dielectric layer is adjacent the channel surface, and the control circuitry is arranged to program memory cells in the array to a high threshold state by FN electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

17. The integrated circuit of claim 15, wherein the tunneling dielectric layer is adjacent the channel surface, and the control circuitry is arranged to program memory cells in the array to a high threshold state by channel hot electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

18. The integrated circuit of claim 15, wherein the control circuitry is arranged to program memory cells in the array to a high threshold state by channel hot electron injection tunneling from the channel across the tunneling dielectric layer to the charge trapping layer, and to apply a voltage to the access gate biasing the access transistor is a current limiting mode.

19. The integrated circuit of claim 15, wherein the memory transistor in the memory cells has a terminal in the semiconductor body, and including a conductive contact between the terminal and a corresponding bit line in the plural bit lines.

20. The integrated circuit of claim 15, wherein the tunneling dielectric layer is adjacent the memory gate.

21. The integrated circuit of claim 15, wherein the tunneling dielectric layer is adjacent the memory gate and the control circuitry is arranged to program the memory cells to a low threshold state by FN hole injection tunneling from the gate across the tunneling dielectric layer to the charge trapping layer and arranged to erase the memory cells to a high threshold state by FN electron tunneling from the gate across the tunneling dielectric layer to the charge trapping layer.

22. The integrated circuit of claim 15, wherein the tunneling dielectric layer is adjacent the memory gate and the control circuitry is arranged to erase the memory cells to a low threshold state by FN hole injection tunneling from the gate across the tunneling dielectric layer to the charge trapping layer and arranged to program the memory cells to a high threshold state by channel hot electron injection from the channel across the multilayer blocking dielectric to the charge trapping layer.

23. The integrated circuit of claim 15, the control circuitry is arranged to apply a positive programming potential across the memory cells in the array, by applying a negative voltage to the semiconductor body and a positive voltage to the memory gate, wherein the positive and negative voltages have absolute values less than 10 volts.

24. The integrated circuit of claim 15, the control circuitry is arranged to apply a negative programming potential across the memory cells in the array, by applying a positive voltage to the semiconductor body and a negative voltage to the memory gate, wherein the positive and negative voltages have absolute values less than 10 volts.

25. The integrated circuit of claim 15, the control circuitry includes logic for reading and programming multiple bits per memory cell in the array.

26. An integrated circuit device, comprising:

a memory array comprising plural bit lines coupled with corresponding columns of memory cells in the array, plural reference lines, a plurality of access gate word lines coupled to access gates in corresponding rows in the array and a plurality of memory gate word lines coupled to memory gates in corresponding rows in the array, wherein the memory cells include respective access transistors having access gates and memory transistors having memory gates arranged in series between the corresponding bit lines and one of the plural reference lines, the respective access transistors coupled either (i) in series between the memory transistors and the corresponding bit lines or (ii) in series between the memory transistors and one of the plural reference lines, and not (iii) in series between the memory transistors and the corresponding bit lines and between the memory transistors and one of the plural reference lines, wherein the respective access transistor does not store charge, and the respective access transistor is adjacent to a doped region of at least one of the corresponding bit lines and one of the plural reference lines;

the memory transistors in the memory cells having respective terminals in a semiconductor body, and including conductive contacts between respective terminals and corresponding bit lines in the plural bit lines;

control circuitry including logic for reading, programming and erasing data stored in the memory cells in the array, and arranged to apply a programming potential across the memory cells in the array, by applying a positive voltage or a negative voltage to the semiconductor body and a negative voltage or a positive voltage to the memory gate, wherein the positive and negative voltages have absolute values less than 10 volts;

wherein the memory transistors and the access transistors have a common structure, the common structure comprising the semiconductor body including a channel having a channel surface and a dielectric stack between the gate and the channel surface; the semiconductor body including first and second doped terminals separated by a channel region without an intervening junction, and the memory gate and access gate of a particular memory cell are arranged adjacent to one another and overly the channel region, and wherein the dielectric stack comprises a tunneling dielectric layer contacting one of the gate and the channel surface including a combination of materials arranged to establish a relatively low valence band energy level near said one of the gate and the channel surface, and an increase in valence band energy level at a first distance from said one of the gate and the channel surface and a decrease in valence band energy at a second distance more than 2 nm from said one of the gate and the channel surface;

a charge trapping dielectric layer between the tunneling dielectric layer and another of the gate and the channel surface having a thickness greater than 5 nm;

a multilayer blocking dielectric between the charge trapping dielectric layer and said another of the gate and the channel surface including an oxide layer with a first dielectric constant and a dielectric layer with a second dielectric constant exceeding the first dielectric constant.

27. The integrated circuit of claim 15, wherein the control circuitry applies different bias arrangements to the memory transistors and the access transistors having the common structure.

28. The integrated circuit of claim 26, wherein the tunneling dielectric layer is adjacent the channel surface, and the control circuitry is arranged to program memory cells in the array to a high threshold state by FN electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

29. The integrated circuit of claim 26, wherein the tunneling dielectric layer is adjacent the channel surface, and the control circuitry is arranged to program memory cells in the array to a high threshold state by channel hot electron injection tunneling from the channel across the tunneling dielectric layer to the charge trapping layer, and arranged to erase memory cells in the array to a low threshold state by FN hole injection tunneling from the channel across the tunneling dielectric layer to the charge trapping layer.

30. The integrated circuit of claim 26, wherein the control circuitry is arranged to program memory cells in the array to a high threshold state by channel hot electron injection tunneling from the channel across the tunneling dielectric layer to the charge trapping layer, and to apply a voltage to the access gate biasing the access transistor is a current limiting mode.

31. The integrated circuit of claim 26, wherein the tunneling dielectric layer is adjacent the memory gate.

32. The integrated circuit of claim 26, wherein the tunneling dielectric layer is adjacent the memory gate and the control circuitry is arranged to program the memory cells to a low threshold state by FN hole injection tunneling from the gate across the tunneling dielectric layer to the charge trapping layer and arranged to erase the memory cells to a high threshold state by FN electron tunneling from the gate across the tunneling dielectric layer to the charge trapping layer.

33. The integrated circuit of claim 26, wherein the tunneling dielectric layer is adjacent the memory gate and the control circuitry is arranged to erase the memory cells to a low threshold state by FN hole injection tunneling from the gate across the tunneling dielectric layer to the charge trapping layer and arranged to program the memory cells to a high threshold state by channel hot electron injection from the channel across the multilayer blocking dielectric to the charge trapping layer.

34. The integrated circuit of claim 26, the control circuitry includes logic for reading and programming multiple bits per memory cell in the array.

35. The integrated circuit of claim 26, wherein the control circuitry applies different bias arrangements to the memory transistors and the access transistors having the common structure.

* * * * *